(12) United States Patent
Young et al.

(10) Patent No.: US 6,775,342 B1
(45) Date of Patent: Aug. 10, 2004

(54) DIGITAL PHASE SHIFTER

(75) Inventors: Steven P. Young, Boulder, CO (US);
John D. Logue, Placerville, CA (US);
Andrew K. Percey, San Jose, CA (US);
F. Erich Goetting, Cupertino, CA (US);
Alvin Y. Ching, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 757 days.

(21) Appl. No.: 09/684,540

(22) Filed: Oct. 6, 2000

Related U.S. Application Data

(63) Continuation-in-part of application No. 09/102,740, filed on Jun. 22, 1998, now Pat. No. 6,289,068.

(51) Int. Cl.[7] .............................................. H04L 25/00
(52) U.S. Cl. ........................ 375/371; 375/373; 375/376; 327/158; 327/161
(58) Field of Search ................................ 375/371, 373, 375/376; 327/147, 149, 153, 156, 158, 161, 231, 232, 233, 234, 235, 236, 237, 261, 269, 270, 271, 277, 284

(56) References Cited

U.S. PATENT DOCUMENTS

| | | |
|---|---|---|
| 5,068,628 A | 11/1991 | Ghoshal |
| 5,465,076 A | 11/1995 | Yamauchi et al. |
| 5,489,864 A | 2/1996 | Ashuri |
| 5,646,564 A | 7/1997 | Erickson et al. |

(List continued on next page.)

FOREIGN PATENT DOCUMENTS

| | | |
|---|---|---|
| EP | 0655840 A2 | 11/1994 |
| EP | 0704975 A1 | 4/1996 |
| JP | 5-191233 | 7/1993 |
| WO | WO 97/ 40576 | 10/1997 |
| WO | WO99/ 14759 | 3/1999 |
| WO | WO 99/67882 | 12/1999 |

OTHER PUBLICATIONS

Microelectronics Group, Lucent Technologies, Inc., Preliminary Data Sheet, May 1998, ORCA OR3Cxx (5 V), and OR3Txxx (3.3 V) Series Field–Programmable Gate Arrays, pp. 3, 69–80, available from Microelectronics Group, Lucent Technologies, Inc., 555 Union Boulevard, Room 30L–15P–BA, Allentown, PA 18103.

"Actel ES Family Digital Phase Lock Loop Usage", by Joel Landry, Sep. 17, 1996, pp. 1–5, available from Actel Corp., 955 East Arques Avenue, Sunnyvale California 94086.

*Primary Examiner*—Betsy L. Deppe
(74) *Attorney, Agent, or Firm*—E. Eric Hoffman; Edel M. Young; Lois D. Cartier

(57) ABSTRACT

After a delay lock loop synchronizes a reference clock signal with a skewed clock signal, a digital phase shifter can be used to shift the skewed clock signal by a small amount with respect to the reference clock signal. The tap/trim settings of a delay line in the main path of the delay lock loop can be transmitted to the digital phase shifter, thereby informing the digital phase shifter of the period of the reference clock signal. In response, the digital phase shifter provides a phase control signal that introduces a delay, which is referenced to the period of the reference clock signal, to either the reference clock signal or the skew clock signal. The phase control signal is proportional to a predetermined fraction of the period of the reference clock signal. The digital phase shifter can be controlled to operate in several modes. In a first fixed mode, the digital phase shifter introduces delay to the skew clock signal. In a second fixed mode, the digital phase shifter introduces delay to the reference clock signal. In a first variable mode, the digital phase shifter can cause the reference clock signal to lead or lag the skew clock signal by controlling the delay of the reference clock signal. In a second variable mode, the digital phase shifter can cause the reference clock signal to lead or lag the skew clock signal by controlling the delay of the skew clock signal.

31 Claims, 21 Drawing Sheets

U.S. PATENT DOCUMENTS

| | | |
|---|---|---|
| 5,712,884 A | 1/1998 | Jeong |
| 5,796,673 A | 8/1998 | Foss et al. |
| 5,963,074 A | 10/1999 | Arkin |
| 5,969,553 A * | 10/1999 | Kishi et al. .................. 375/376 |
| 6,043,717 A | 3/2000 | Kurd |
| 6,052,011 A * | 4/2000 | Dasgupta .................... 327/270 |
| 6,104,223 A | 8/2000 | Chapman et al. |
| 6,125,157 A | 9/2000 | Donnelly et al. |
| 6,151,356 A | 11/2000 | Spagnoletti et al. |
| 6,184,753 B1 | 2/2001 | Ishimi et al. |
| 6,194,930 B1 | 2/2001 | Matsuzaki et al. |
| 6,292,040 B1 | 9/2001 | Iwamoto et al. |
| 6,356,122 B2 * | 3/2002 | Sevalia et al. .............. 327/105 |
| 6,501,309 B1 | 12/2002 | Tomita |
| 6,625,242 B1 * | 9/2003 | Yoo et al. .................... 375/376 |

* cited by examiner

DIGITAL PHASE SHIFTER

PRIORITY

This is a continuation-in-part of U.S. patent application Ser. No. 09/102,740 filed Jun. 22, 1998 U.S. Pat. No. 6,289,068 B1.

CROSS-REFERENCE TO RELATED APPLICATIONS

This application relates to commonly assigned U.S. Pat. No. 6,400,735 B1 issued on Jun. 4, 2002, entitled "Glitchless Delay Line Using Gray Code Multiplexer", which is incorporated herein by reference.

FIELD OF THE INVENTION

The present invention relates to delay lock loops (DLLs) for digital electronics. More specifically, the present invention relates to DLLs capable of locking clock signals over a wide frequency range.

BACKGROUND OF THE INVENTION

Synchronous digital systems, including board level systems and chip level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

Delay lock loops are used in digital systems to minimize clock skew. Delay lock loops typically use delay elements to synchronize the active edges of a reference clock signal in one part of the system with a feedback clock signal from a second part of the system. FIG. 1 shows a block diagram of a conventional delay lock loop 100 coupled to logic circuits 190. Delay lock loop 100, which comprises a delay line 110 and a phase detector 120, receives a reference clock signal REF_CLK and drives an output clock signal O_CLK.

Delay line 110 delays reference clock signal REF_CLK by a variable propagation delay D before providing output clock signal O_CLK. Thus, each clock edge of output clock signal O_CLK lags a corresponding clock edge of reference clock signal REF_CLK by propagation delay D (see FIG. 2A). Phase detector 120 controls delay line 110, as described below. Delay line 110 is capable of producing a minimum propagation delay D_MIN and a maximum propagation delay D_MAX.

Before output clock signal O_CLK reaches logic circuits 190, output clock signal O_CLK is skewed by clock skew 180. Clock skew 180 can be caused by delays in various clock buffers (not shown) or propagation delays on the clock signal line carrying output clock signal O_CLK (e.g., due to heavy, loading on the clock signal line). To distinguish output clock signal O_CLK from the skewed version of output clock signal O_CLK, the skewed version is referred to as skewed clock signal S_CLK. Skewed clock signal S_CLK drives the clock input terminals (not shown) of the clocked circuits within logic circuits 190. Skewed clock signal S_CLK is also routed back to delay lock loop 100 on a feedback path 170. Typically, feedback path 170 is dedicated specifically to routing skewed clock signal S_CLK to delay lock loop 110. Therefore, any propagation delay on feedback path 170 is minimal and causes only negligible skewing.

FIG. 2A provides a timing diagram of reference clock signal REF_CLK, output clock signal O_CLK, and skewed clock signal S_CLK. All three clock signals have the same frequency F (not shown) and period P, and all are active-high (i.e., the rising edge is the active edge). Since output clock signal O_CLK is delayed by propagation delay D, a clock edge 220 of output clock signal O_CLK lags corresponding clock edge 210 of reference clock signal REF_CLK by propagation delay D. Similarly, a clock edge 230 of skewed clock signal S_CLK lags corresponding clock edge 220 of output clock signal O_CLK by a propagation delay SKEW, which is the propagation delay caused by clock skew 180 (FIG. 1). Therefore, clock edge 230 of skewed clock signal S_CLK lags clock edge 210 of reference clock signal REF_CLK by a propagation delay DSKEW, which is equal to propagation delay D plus propagation delay SKEW.

Delay lock loop 100 controls propagation delay D by controlling delay line 110. However, delay line 110 cannot create negative delay; therefore, clock edge 230 cannot be synchronized to clock edge 210. Fortunately, clock signals are periodic signals. Therefore, delay lock loop 100 can synchronize reference clock signal REF_CLK and skewed clock signal S_CLK by further delaying output clock signal O_CLK such that clock edge 240 of skewed clock signal S_CLK is synchronized with clock edge 210 of reference clock signal REF_CLK. As shown in FIG. 2B, propagation delay D is adjusted so that propagation delay DSKEW is equal to period P. Specifically, delay line 110 is tuned so that propagation delay D is increased until propagation delay D equals period P minus propagation delay SKEW. Although propagation delay DSKEW could be increased to any multiple of period P to achieve synchronization, most delay lock loops do not include a delay line capable of creating such a large propagation delay.

Phase detector 120 (FIG. 1) controls delay line 110 to regulate propagation delay D. The actual control mechanism for delay lock loop 100 can differ. For example, in one version of delay lock loop 100, delay line 110 starts with a propagation delay D equal to minimum propagation delay D_MIN, after power-on or reset. Phase detector 110 then increases propagation delay D until reference clock signal REF_CLK is synchronized with skewed clock signal S_CLK. In another system, delay lock loop 100 starts with a propagation delay D equal to the average of minimum propagation delay D_MIN and maximum propagation delay D_MAX, after power-on or reset. Phase detector 120 then determines whether to increase or decrease (or neither) propagation delay D to synchronize reference clock signal REF_CLK with skewed clock signal S_CLK. For example, phase detector 120 would increase propagation delay D for the clock signals depicted in FIG. 2A. However, phase detector 120 would decrease propagation delay D for the clock signals depicted in FIG. 2C.

In FIG. 2C, skewed clock signal S_CLK is said to "lag" reference clock signal REF_CLK, because the time between a rising edge of reference clock signal REF_CLK and the next rising edge of skewed clock signal S_CLK is less than the time between a rising edge of skewed clock signal S_CLK and the next rising edge of reference clock signal REF_CLK. However, in FIG. 2A, reference clock signal REF_CLK is said to "lag" skewed clock signal S_CLK, because the time between a rising edge of skewed clock signal S_CLK and the next rising edge of reference clock signal REF_CLK is less than the time between a rising edge of reference clock signal REF_CLK and the next rising clock edge of skewed clock signal S_CLK. Alternatively, in FIG. 2A skewed clock signal S_CLK could be said to "lead" reference clock signal REF_CLK.

After synchronizing reference clock signal REF_CLK and skewed clock signal S_CLK, delay lock loop 100 monitors reference clock signal REF_CLK and skewed clock signal S_CLK and adjusts propagation delay D to maintain synchronization. For example, if propagation delay SKEW increases, perhaps caused by an increase in temperature, delay lock loop 100 must decrease propagation delay D to compensate. Conversely, if propagation delay SKEW decreases, perhaps caused by a decrease in temperature, delay lock loop 100 must increase propagation delay D to compensate. The time in which delay lock loop 100 is attempting to first synchronize reference clock signal REF_CLK and skewed clock signal S_CLK, is referred to as lock acquisition. The time in which delay lock loop 100 is attempting to maintain synchronization is referred to as lock maintenance. The value of propagation delay D at the end of lock acquisition, i.e. when synchronization is initially established, is referred to as initial propagation delay ID.

However, as explained above, delay line 110 can only provide a propagation delay between a minimum propagation delay D_MIN and a maximum propagation delay D_MAX. During lock maintenance, delay lock loop 100 may lose synchronization if a propagation delay D smaller than minimum propagation delay D_MIN is required to maintain synchronization. Similarly, synchronization may be lost if a propagation delay D greater than maximum propagation delay D_MAX is required to maintain synchronization.

For example, if lock acquisition occurs while the system using delay lock loop 100 is at a very high temperature, delay lock loop 100 is likely to achieve synchronization with a very small initial propagation delay ID, since propagation delay SKEW is likely to be large with respect to period P. As the system's temperature increases further, propagation delay SKEW is likely to increase to a point where propagation delay SKEW plus minimum propagation delay D_MIN is greater than period P. In this situation, delay lock loop 100 must undergo lock acquisition again, which may introduce glitches and noise into output clock signal O_CLK, in turn causing glitches and noise in skewed clock signal S_CLK. For critical systems, such glitches are intolerable. Further, for systems designed for operation at multiple clock frequencies, low frequency operation is likely to compound the problems since clock period P is very long. Long clock periods may cause propagation delay D to vary over a wider time interval. Thus, there is a need for a delay lock loop which can maintain synchronization over a wide range of clock frequencies and environmental extremes.

In addition, conventional delay lock loop circuits provide for precise synchronization of the reference clock signal REF_CLK and the skew clock signal S_CLK. It would be desirable to have a delay lock loop circuit which is capable of providing a skew clock signal S_CLK which is precisely shifted by a relatively small amount with respect to the reference clock signal REF_CLK. It would further be desirable if such delay lock loop circuit were capable of providing both a leading and lagging relationship. Such a delay lock loop circuit would enable the precise control of clock phase in logic circuits. Such control allows, for example, more accurate timing budget allocation, which in turn, allows synchronous digital systems to run at faster speeds.

Delay lock loop circuit 100 provides an S_CLK signal having a single frequency in response to the REF_CLK signal. For example, the S_CLK signal may have a frequency of 100 MHz. The Federal Communications Commission (FCC) has provided limits on the electromagnetic energy that a chip may emit within a specified frequency bandwidth, which depends on the characteristics of the system being tested. One such measurement method employs a 1 MHz bandwidth window. Because all of the energy emitted by the S_CLK signal exists at a single frequency, all of the energy will also exist within such a window. Therefore, for systems that violate FCC limits, special techniques must be employed to reach compliance. Conventional compliance techniques include the use of stand-alone (i.e., off-chip) spread spectrum clock oscillators and metal shielding around the radiating components.

It would therefore be desirable to have a clock system that overcomes the electromagnetic emission limitations of delay lock loop 100.

SUMMARY OF THE INVENTION

The present invention provides a delay lock loop that synchronizes the reference clock signal with the skewed clock signal using a delay line having an initial propagation delay within a lock window. The lock window is a period of time between the minimum delay of the propagation delay and the maximum propagation delay. The extent of the lock window is chosen to ensure that changes in environmental conditions or clock frequencies, when compensated for by changing the propagation delay of the delay line, do not cause a loss of synchronization. A delay lock loop in accordance with one embodiment of the present invention incorporates a clock phase shifter in addition to the delay line to synchronize the reference clock. The increased flexibility provided by the clock phase shifter increases the range of frequencies at which the delay lock loop will operate.

The delay line receives the reference clock signal from a reference input terminal of the delay lock loop. The output of the delay line (i.e., the delayed clock signal) is provided to the clock phase shifter, which can generate one or more phase-shifted clock signals. An output generator receives the delayed clock signal and the one or more phase-shifted clock signals. The output generator provides one of the clock signals as the output clock signal on an output terminal. A phase detector compares the reference clock signal with the skewed clock signal, which is received on a feedback input terminal of the delay lock loop, to determine whether to increase or decrease the propagation delay of the delay line to synchronize the reference clock signal and the skewed clock signal.

One embodiment of the clock phase shifter generates N–1 phase-shifted clock signals. Each of the phase-shifted clock signals is phase-shifted from the other N–2 clock signals and the delayed clock signal by 360/N degrees. For example, if the clock phase shifter generated 3 phase-shifted clock signals (i.e., N is equal to four), the phase-shifted clock signals would be phase-shifted from the delayed clock signal by 90 degrees, 180 degrees, and 270 degrees. The clock phase shifter can be implemented using N delay lines and a phase detector.

The delay lock loop can include a controller to control the delay line and the output generator. In one embodiment of the invention, the controller causes the output generator to drive the delayed clock signal as the output clock. The controller synchronizes the reference clock signal with the skewed clock signal by adjusting the propagation delay of the delay line to an initial delay. If the initial delay is not within the lock window, the controller causes the output generator to drive a first phase-shifted clock signal as the output signal. The controller and phase detector then synchronize the reference clock signal with the skewed clock signal by adjusting the propagation delay of the delay line to a second initial delay. If the second initial delay is not within the lock window, the controller causes the output generator to use a second phase-shifted clock signal as the output clock. The controller continues in this manner until an initial delay within the lock window is found.

In another embodiment of the invention, the clock phase shifter is coupled to receive the reference clock signal. The clock phase shifter generates phase-shifted clock signals that are phase-shifted from the reference clock signals. The reference clock signal or one of the phase-shifted clock signals from the clock shifter is selected to be the input signal of the delay line. The delay line is controlled by the controller and the phase detector to delay the input clock signal and synchronize the skewed clock signal with the reference clock signal.

After the delay lock loop synchronizes the reference clock signal with the skewed clock signal, a digital phase shifter can be used to shift the skewed clock signal by a small amount with respect to the reference clock signal. In accordance with one embodiment, the tap settings and the finer trim settings of a delay line in the clock phase shifter are transmitted to the digital phase shifter, thereby informing the digital phase shifter of the period of the reference clock signal. In response, the digital phase shifter provides a phase control signal that introduces a delay, which is referenced to the period of the reference clock signal, to either the reference clock signal or the skew clock signal. The phase control signal is proportional to a fraction of the period of the reference clock signal. In one embodiment, the period of the reference clock signal is determined from the tap/trim settings of a delay line in the clock phase shifter. The delay line can have, for example, 512 tap/trim units. The phase control signal is determined by multiplying the equivalent tap/trim units used by a delay line in the clock phase shifter by a fraction. The fraction can be determined by the contents of configuration memory bits stored in an FPGA, or by a user-defined signal.

The digital phase shifter can be controlled to operate in one of two fixed modes or in one of two variable modes. In the first fixed mode, the digital phase shifter introduces delay to the skew clock signal. For example, the digital phase shifter can introduce a delay in the range of 0 to 511 tap/trim units to the skew clock signal in the first fixed mode. In the second fixed mode, the digital phase shifter introduces delay to the reference clock signal. For example, the digital phase shifter can introduce a delay in the range of 0 to 511 tap/trim units to the reference clock signal in the second fixed mode. In the first variable mode, the digital phase shifter can introduce a delay equal to 255 to −255 tap/trim units to the reference clock signal. In the second variable mode, the digital phase shifter can introduce a delay equal to 255 to −255 tap/trim units to the skew clock signal.

In accordance with another embodiment, the digital phase shifter is capable of operating in a low frequency mode or a high frequency mode. The digital phase shifter is controlled to adjust the tap/trim setting provided by the delay line of the clock phase shifter to compensate for different overhead delays experienced by the clock phase shifter in the low frequency mode and the high frequency mode.

In yet another embodiment of the present invention, the frequency of the skew clock signal can be dithered around a base frequency, thereby enabling this clock signal to comply with FCC requirements for electromagnetic emissions in many cases. That is, delay can be introduced such that the skew clock signal exhibits slightly different frequencies in successive periods. For example, the frequency of a 100 MHz clock signal can be adjusted to have frequencies of approximately 98, 98.5, 99, 99.5, 100, 100.5, 101, 101.5, and 102 MHz during different periods. This configuration is referred to as a "spread-8" configuration, because eight frequencies are generated in addition to the base frequency of 100 MHz. For a 1 MHz window measurement method, because the frequencies are spread in 0.5 MHz increments, only three of the nine frequencies are included in the window. As a result, ⅔ of the energy of the clock signal is not included when determining whether the clock signal meets the FCC electromagnetic emission requirements. By spreading the frequencies above and below the base frequency in a regular manner, the average frequency of the clock signal becomes equal to the base frequency. Other configurations, including, but not limited to, spread-2, spread-4 and spread-6 configurations, can be implemented in accordance with the present invention.

In a preferred embodiment, the clock frequencies are generated by a digital spread spectrum (DSS) circuit, which operates with the digital phase shifter to insert small delays in the skew clock signal. Because the digital phase shifter delay must be able to adjust both up and down relative to its starting point, the variable mode of the digital phase shifter is typically used in conjunction with the DSS circuit. In accordance with one embodiment, the DSS circuit provides particular patterns of digital tap/trim adjustments to optimize the operation of the digital phase shifter.

In another embodiment, the DSS circuit and/or pattern of digital tap/trim adjustments necessary to successfully implement spread spectrum generation can be used with a conventional delay line, independent of the digital phase shifter.

The present invention will be more fully understood in view of the following description and drawings.

DETAILED DESCRIPTION OF THE DRAWINGS

Figure 1:
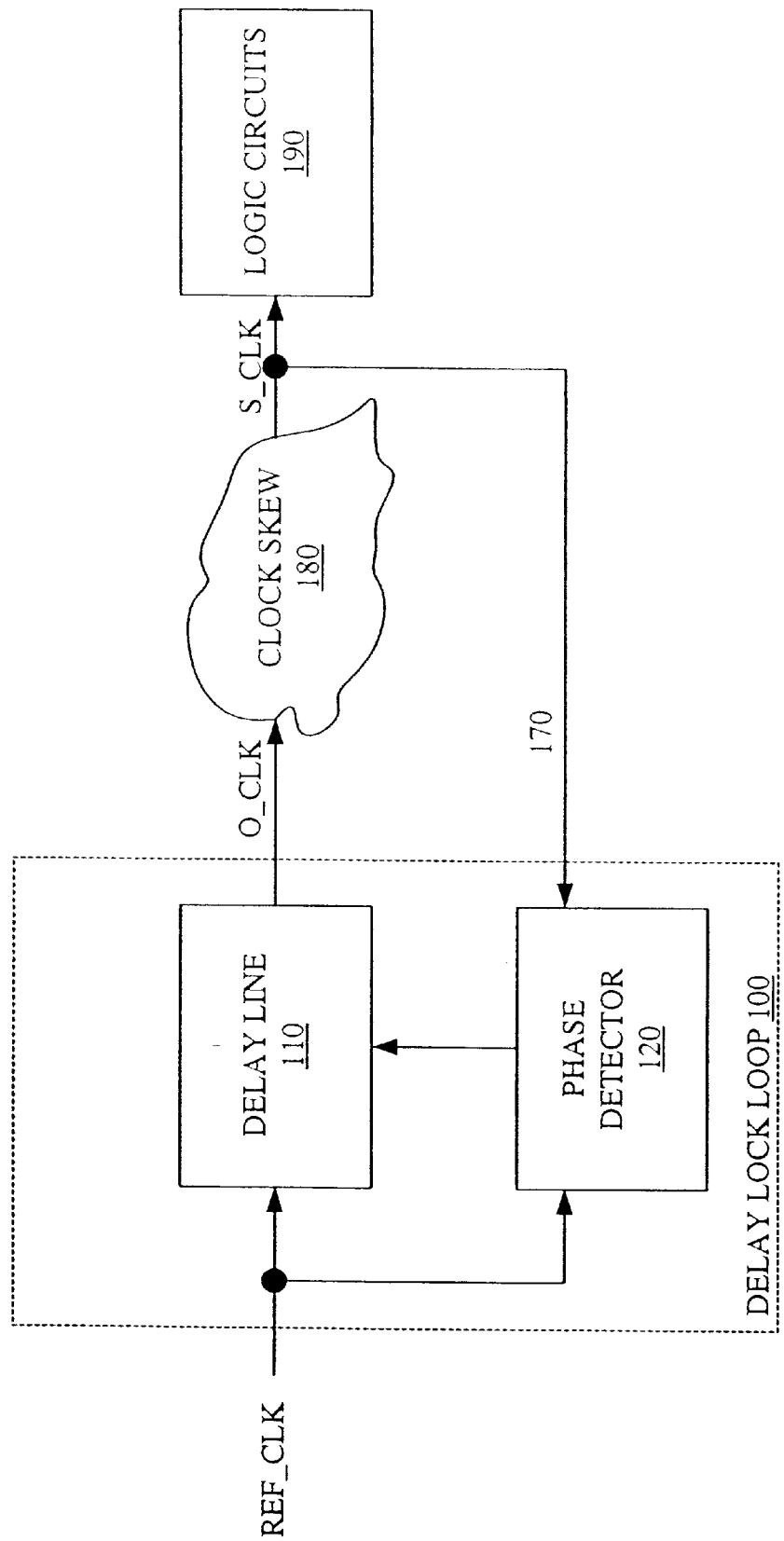
FIG. 1 is a block diagram of a system using a conventional delay lock loop.
Figure 2A:
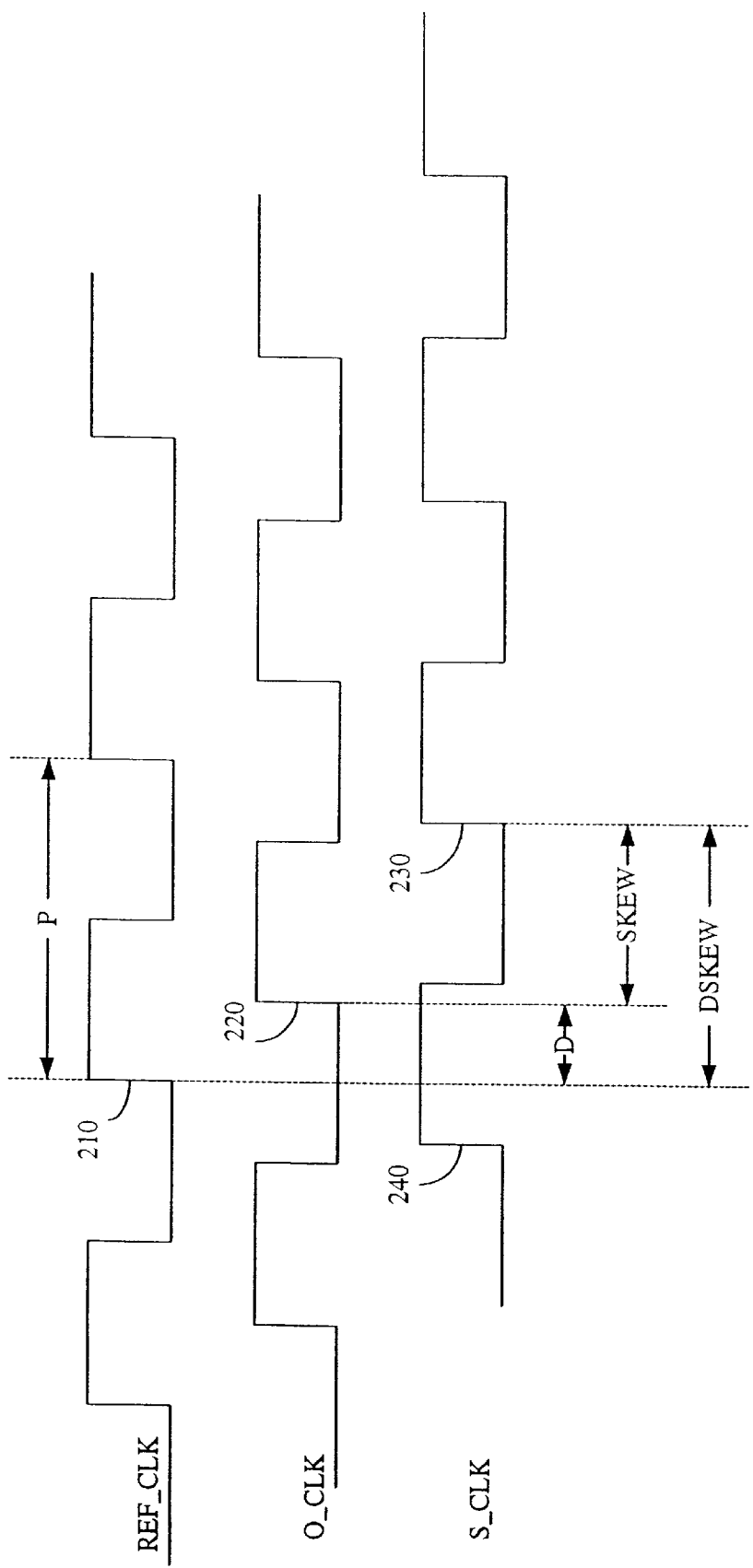
FIGS. 2A, 2B and 2C are timing diagrams for the system of FIG. 1.
Figure 2B:
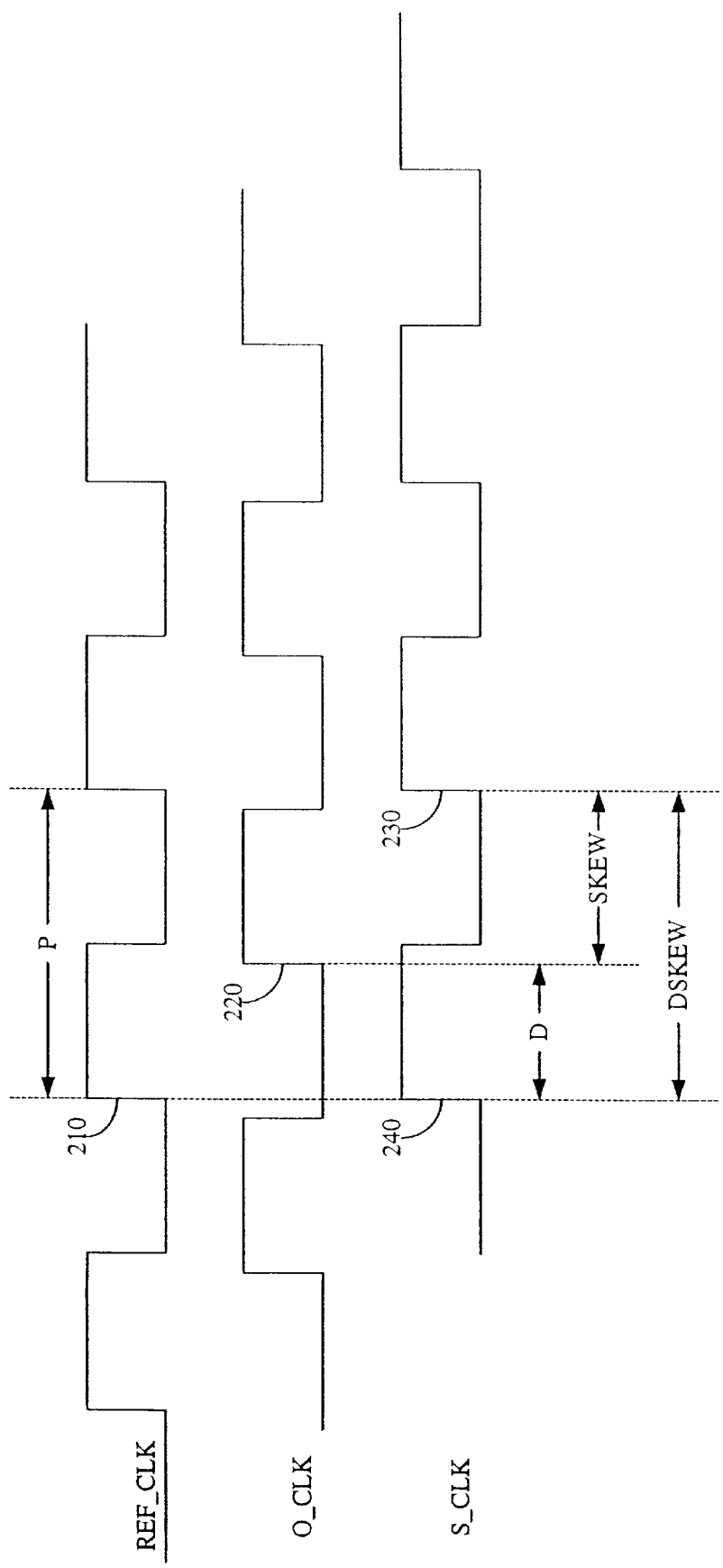
Figure 2C:
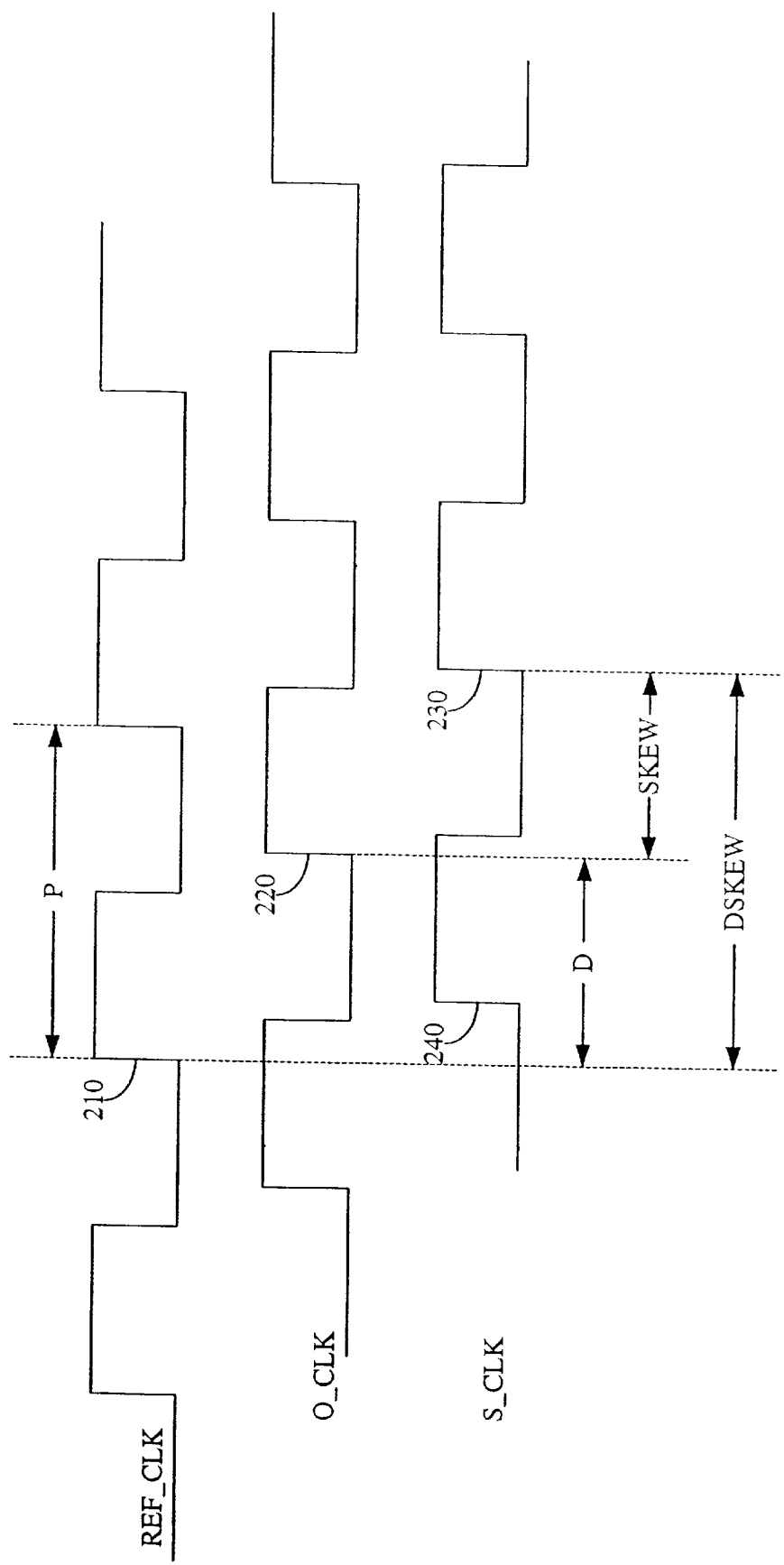
Figure 3:
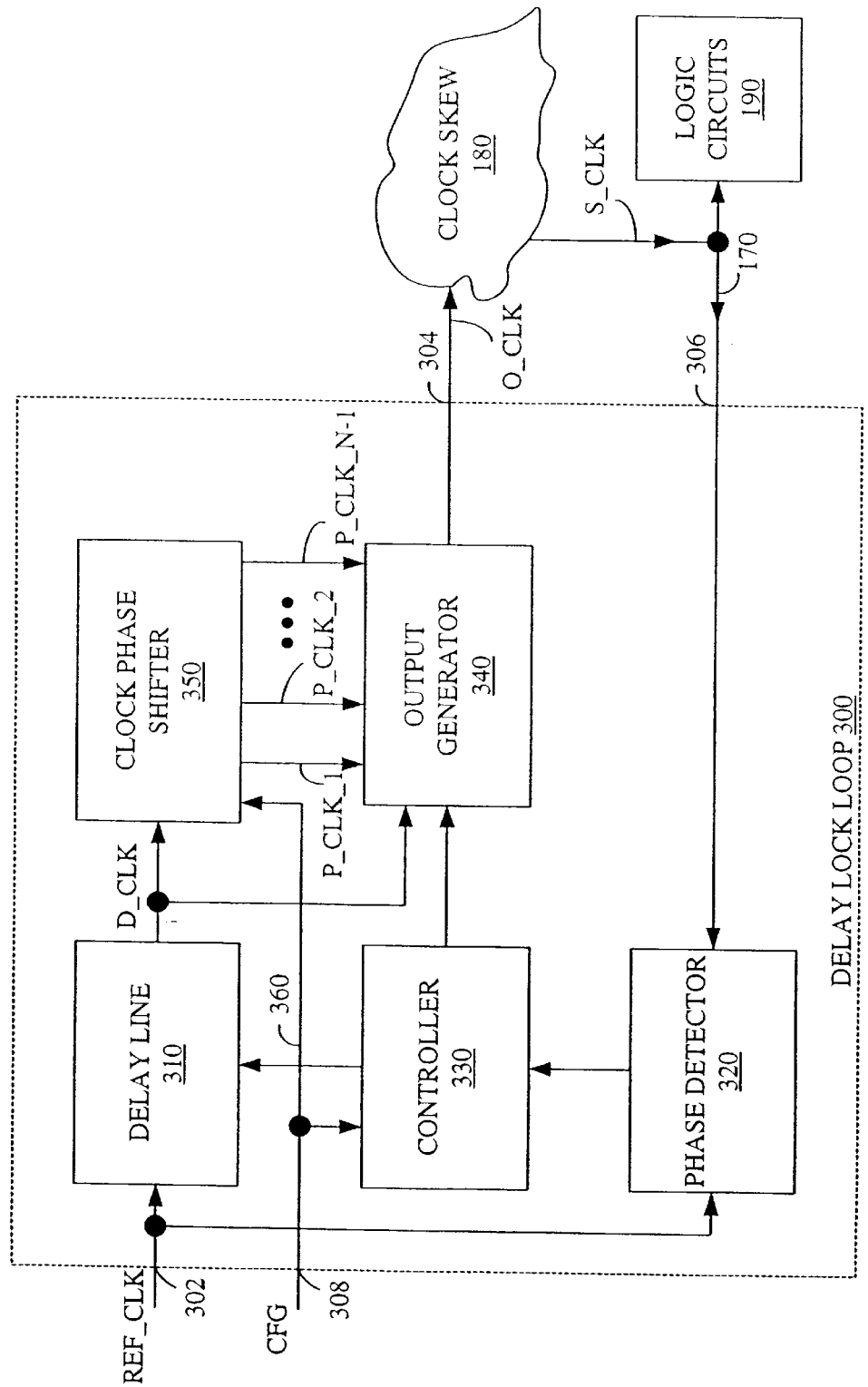
FIG. 3 is a block diagram of a system using an embodiment of a delay lock loop in accordance with the present invention.

FIG. 3 is a block diagram of a system using a delay lock loop in accordance with one embodiment of the present invention. Delay lock loop comprises a delay line 310, a clock phase shifter 350, a controller 330, an output generator 340, and a phase detector 320. Delay lock loop receives reference clock signal REF_CLK on a reference input terminal 302 and generates output clock signal O_CLK on output terminal 304. As explained above with respect to FIG. 1, output clock signal O_CLK is skewed by clock skew 180 into skewed clock signal S_CLK, which clocks logic circuits 190. Skewed clock signal S_CLK is also fed back to a feedback terminal 306 of delay lock loop on feedback path 170.

Within delay lock loop 300, reference clock signal REF_CLK is delayed by delay line 310 to generate delayed clock signal D_CLK. Delayed clock signal D_CLK is delayed from clock signal REF_CLK by a propagation delay D in delay line 310. One embodiment of delay lock loop 300 uses an adjustable delay line described in U.S. Pat. No. 6,400,735 B1 issued on Jun. 4, 2002, entitled "Glitchless Delay Line Using Gray Code Multiplexer", which is referenced above. However, other adjustable delay lines can also be used with delay lock loop 300. Delayed clock signal D_CLK is provided to an input terminal of a clock phase shifter 350 and to an input terminal of an output generator 340.

Clock phase shifter 350 generates one or more phase-shifted clock signals P_CLK_1 to P_CLK_N−1, where N is a positive integer. In one embodiment, phase-shifted clock signal P_CLK_1 is phase-shifted by 360/N degrees from delayed clock signal D_CLK. Phase-shifted clock signal P_CLK_2 is phase-shifted by 2*(360/N) degrees. Phase-shifted clock signal P_CLK_N−1 is phase-shifted by (N−1) *(360/N) degrees. Thus, in general a phase-shifted clock signal P_CLK_Z is phase-shifted by Z*(360/N), where Z is an integer between 1 and (N−1), inclusive. Delayed clock signal D_CLK can be considered a phase-shifted clock signal P_CLK_0 since delayed clock signal D_CLK has a 0 degree phase shift from itself. Further, in some embodiments of delay lock loop 300, clock phase shifter 350 generates a phase-shifted signal P_CLK_N that has the same phase and frequency as delayed clock signal D_CLK.

Thus, in an embodiment of clock phase shifter 350 where N is equal to four, phase-shifted clock signal P_CLK_1 is phase-shifted 90 degrees from delayed clock signal D_CLK. It logically follows that phase-shifted clock signal P_CLK_2 is phase-shifted by 180 degrees from delayed clock signal D_CLK and phase-shifted clock signal P_CLK_3 is phase-shifted by 270 degrees from delayed clock signal D_CLK. However, the principles of the present invention are also suitable for other embodiments of clock phase shifter 350 using other patterns of phase shifting between the phase-shifted clock signals.

Phase shifting is a concept in the frequency domain of a clock signal. The equivalent of phase shifting in the time domain is delaying the clock signal. Specifically, if a first clock signal is phase-shifted from a second clock signal by X degrees, the first clock signal is delayed by X*(P/360), where P is the period of the first and second clock signals. Thus, if phase-shifted clock signal P_CLK_1 is phase-shifted 90 degrees from delayed clock signal D_CLK, phase-shifted clock signal P_CLK_1 is delayed by one-fourth of the period of delayed clock signal D_CLK. To distinguish delays caused by phase shifting from other propagation delays, delays caused by phase shifting are referred to as phase-shifted delays P_D_Z. Since a phase-shifted clock signal P_CLK_Z is phase-shifted by Z*(360/N) degrees, phase-shifted clock signal P_CLK_Z has a phase-shifted delay P_D_Z equal to Z*(P/N), where Z is an integer between 1 and (N−1), inclusive.

Figure 4:
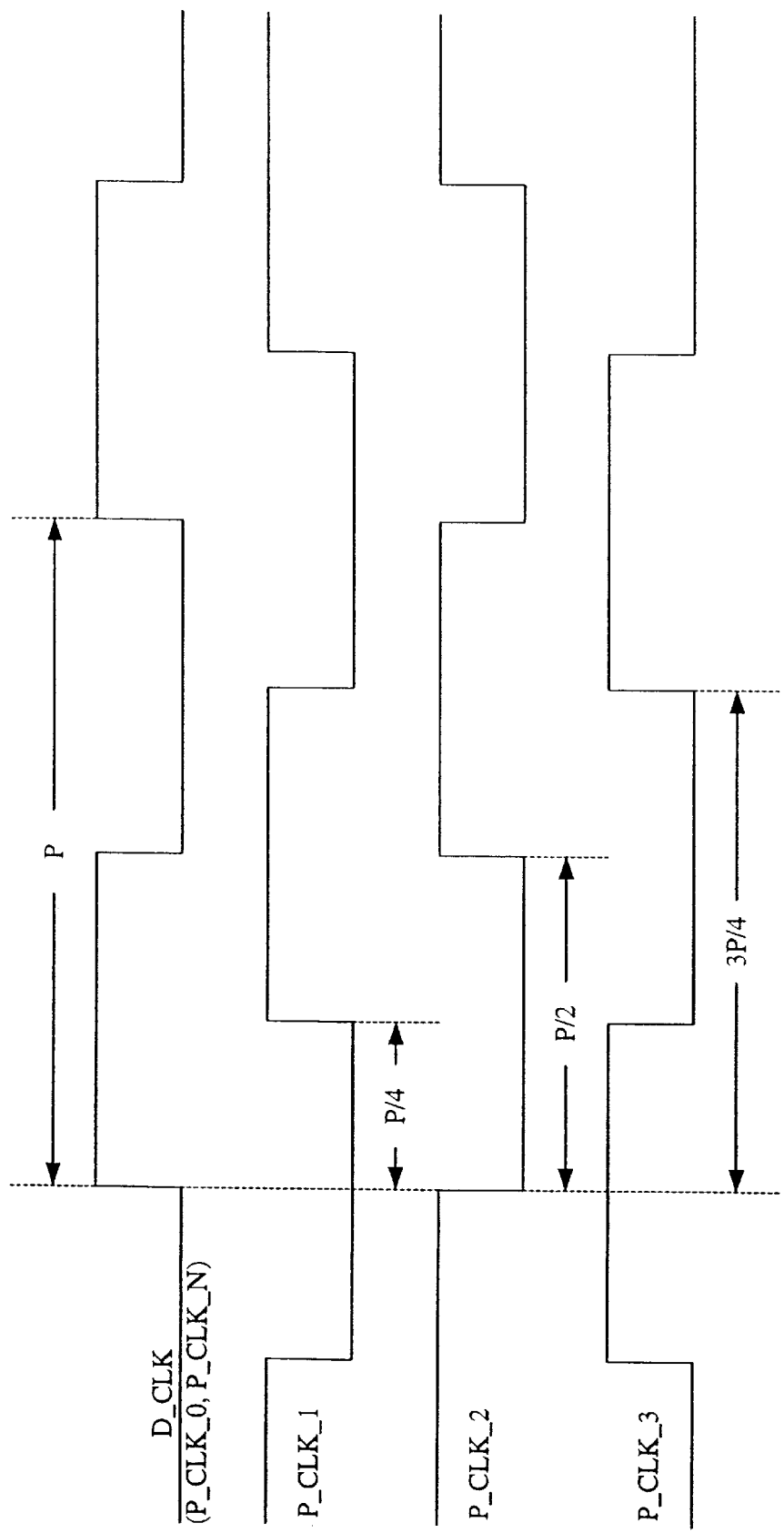
FIG. 4 is a timing diagram for the delay lock loop of FIG. 3.

FIG. 4 illustrates a timing diagram for delay lock loop (FIG. 3) wherein N equals 4. Specifically, clock phase shifter 350 generates phase-shifted clock signal P_CLK_1 90 degrees out of phase with delayed clock signal D_CLK. Thus, phase-shifted clock signal P-CLK_1 is delayed by one-fourth of clock period P. Clock phase shifter 350 generates phase-shifted clock signal P_CLK_2 180 degrees out of phase with delayed clock signal D_CLK. Thus, phase-shifted clock signal P_CLK_2 is delayed by half of clock period P. Finally, clock phase shifter 350 generates phase-shifted clock signal P_CLK_3 270 degrees out of phase with delayed clock signal D_CLK. Thus, phase-shifted clock signal P_CLK_3 is delayed by three-fourths of clock period P.

Returning to FIG. 3, clock phase shifter 350 provides the phase-shifted clock signals to various input terminals of output generator 340. In some embodiments of delay lock loop 300, clock phase shifter 350 can be configured using one or more configuration signals CFG on an optional configuration bus 360. An embodiment of clock phase shifter 350 that is configured by configuration signals CFG is described below with respect to FIG. 7. Configuration signals CFG are received on configuration terminals 308 and are routed to clock phase shifter 350 and controller 330 by configuration bus 360. Output generator 340 selects either delayed clock signal D_CLK or one of the phase-shifted clock signals to provide as output clock signal O_CLK. For embodiments of delay lock loop in which clock phase shifter 350 provides phase-shifted clock signal P_CLK_N, output generator 340 can use phase-shifted clock signal P_CLK_N in place of delayed clock signal D_CLK. Controller 330 controls output generator 340.

Controller 330 receives phase information regarding reference clock signal REF_CLK and skewed clock signal S_CLK from phase detector 320. Specifically, phase detector 320 informs controller 330 whether propagation delay D from delay line 310 should be increased or decreased to achieve synchronization of skewed clock signal S_CLK with reference clock signal REF_CLK. For embodiments of phase detector 320 that only determine whether to increase or decrease propagation delay D, a jitter filter (not shown) can be used to reduce clock jitter. In one embodiment, the jitter filter is an up/down counter (not shown) that decrements by one if propagation delay D should be decreased and increments by one if propagation delay D should be increased. However, propagation delay D is not adjusted until the up/down counter reaches 0 or some other predetermined number. When propagation delay D is adjusted, the up/down counter is reset to one-half the maximum value. In other embodiments, phase detector 320 calculates the amount propagation delay D should be increased or decreased. During lock acquisition, controller 330 attempts to synchronize skewed clock signal S_CLK with reference clock signal REF_CLK so that initial propagation delay ID of propagation delay D is within a lock window W.

Figure 5:
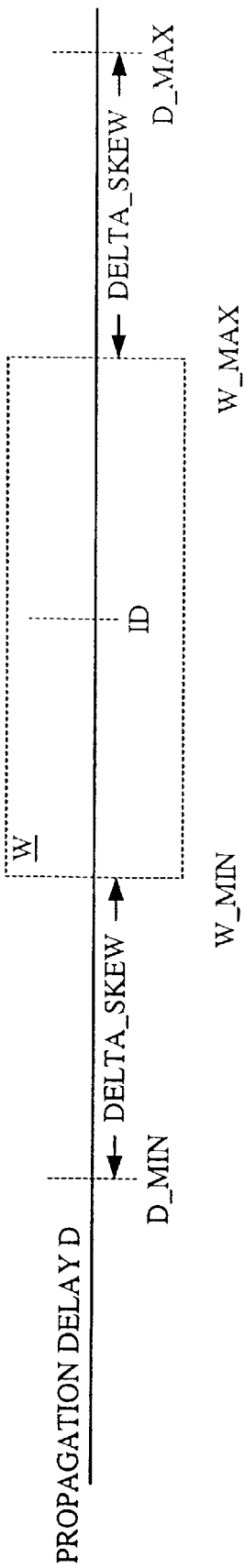
FIG. 5 illustrates a lock window as used in accordance with one embodiment of the present invention.

FIG. 5 illustrates the concepts of lock window W. As explained above, propagation delay D must be between minimum propagation delay D_MIN and maximum propagation delay D_MAX. Typical values for D_MIN and D_MAX are 3.2 nanoseconds and 46.8 nanoseconds, respectively. During lock acquisition, controller 330 ensures that initial propagation delay ID of propagation delay D is within lock window W. Specifically, when synchronization is first established initial propagation delay ID must be between lock window minimum W_MIN and lock window maximum W_MAX. The limits on lock window W are set to guarantee that once delay lock loop completes locks acquisition, delay lock loop can maintain synchronization as long as the system containing delay lock loop operates within the design guidelines of the system.

For example, the system containing delay lock loop generally can operate in a range of operating conditions. The range of operating conditions includes a maximum extreme condition in which propagation delay SKEW is maximized at a propagation delay value SKEW_MAX. Similarly, the range of operating conditions also includes a minimum extreme condition in which propagation delay SKEW is minimized at a propagation delay value SKEW_MIN. Thus, the maximum change (DELTA_SKEW) in propagation delay SKEW during operation of the system is equal to propagation delay value SKEW_MAX minus propagation delay value SKEW_MIN (i.e., DELTA_SKEW=SKEW_MAX −SKEW_MIN). For maximum protection during lock maintenance, lock window minimum W_MIN can be equal to minimum propagation delay D_MIN plus DELTA_SKEW. Similarly, lock window maximum W_MAX can be equal to maximum propagation delay D_MAX minus DELTA_SKEW. In one embodiment of the present invention, lock window minimum W_MIN is equal to approximately 16.5% of maximum propagation delay D_MAX and lock window maximum W_MAX is equal to approximately 67.8% of maximum propagation delay D_MAX.

As explained above with respect to FIG. 1, for a conventional delay lock loop synchronization of skewed clock signal S_CLK with reference clock signal REF_CLK is achieved when propagation delay D plus propagation delay SKEW is equal to a multiple of period P. In equation form:

$$D + SKEW = MULT(P) \quad (1)$$

where MULT(P) refers to a multiple of P. Usually, the smallest multiple of P greater than SKEW is used.

With delay lock loop 300, controller 330 can also use the delays from the phase-shifted clock signals. Thus delay lock loop can achieve synchronization if propagation delay D plus a phase-shifted delay P_D from a phase-shifted clock signal plus propagation delay SKEW is a multiple of period P. In equation form:

$$D + P\_D\_Z + SKEW = MULT(P) \quad (2)$$

where P_D_Z refers to a phase-shifted delay from phase-shifted clock signal P_CLK_Z. Usually, the smallest multiple of P greater than propagation delay SKEW plus phase-shifted delay P_D_Z is used. As explained above with respect to FIG. 3, in one embodiment of clock phase shifter 350 phase-shifted delay P_D_Z of a phase-shifted clock signal P_CLK_Z is equal to $Z*(P/N)$, where Z is an integer between 0 and (N−1), inclusive. If Z is equal to 0, controller 330 causes output generator 340 to use delayed clock signal D_CLK as output clock signal O_CLK. Thus, phase-shifted delay P_D_0 is equal to 0.

For clarity, initial delay ID can be referred to initial delay ID_0 if output generator 340 uses delayed clock signal D_CLK for output clock signal O_CLK. Similarly, initial delay ID can be referred to as initial delay ID_Z, if output generator 340 uses phase-shifted clock signal P_CLK_Z for output clock signal O_CLK, where Z is a positive integer between 1 and (N−1), inclusive. Thus, at the end of lock acquisition, equation (2) can be rewritten as:

$$ID\_Z + P\_D\_Z + SKEW = MULT(P) \quad (3)$$

Re-arranging equation (3) provides:

$$ID\_Z = MULT(P) - SKEW - P\_D\_Z \quad (4)$$

and substituting $Z*(P/N)$ for P_D_Z provides:

$$ID\_Z = MULT(P) - SKEW - Z*(P/N) \quad (5)$$

Usually, the smallest multiple of P that results in a positive initial delay ID_Z is used. In situations where initial delay ID_Z is less than minimum propagation delay D_MIN or greater than maximum propagation delay D_MAX, delay lock loop cannot synchronize skewed clock signal S_CLK with reference clock signal REF_CLK using phase-shifted clock signal P_CLK_Z.

Because controller 330 can select any one of phase-shifted clock signals P_CLK_Z to drive output clock signal O_CLK, controller 330 can select from N initial delay values. The possible initial delay values range from a minimum offset value (MULT(P)−SKEW) to a maximum value (MULT(P)−SKEW+(N−1)/(N*period P)). The difference between each initial delay value is period P divided by N. For example, if N equals four, period P equals 40 nanoseconds, and propagation delay SKEW equals 25 nanoseconds; then initial delays ID_0, ID_1, ID_2, and ID_3 equal 15 nanoseconds, 5 nanoseconds, 35 nanoseconds, and 25 nanoseconds, respectively (as calculated using equation (5)). If N equals four, period P equals 40 nanoseconds; and propagation delay SKEW equals 55 nanoseconds; then initial delays ID_0, ID_1, ID_2, and ID_3 equal 25 nanoseconds, 15 nanoseconds, 5 nanoseconds, and 35 nanoseconds, respectively. Thus, controller 330 is likely to find one or more initial delay values within lock window W. If more than one initial delay value is within lock window W, controller 330 can select any one of the initial delay values within lock window W.

Some embodiments of controller 330 can perform the calculations described above to determine which phase-shifted clock signal P_CLK_Z to use. However, other embodiments use trial and error to determine which phase-shifted clock signal P_CLK_Z to use. An embodiment of controller 330 that uses trial and error is described below with respect to FIG. 9.

Figure 6:
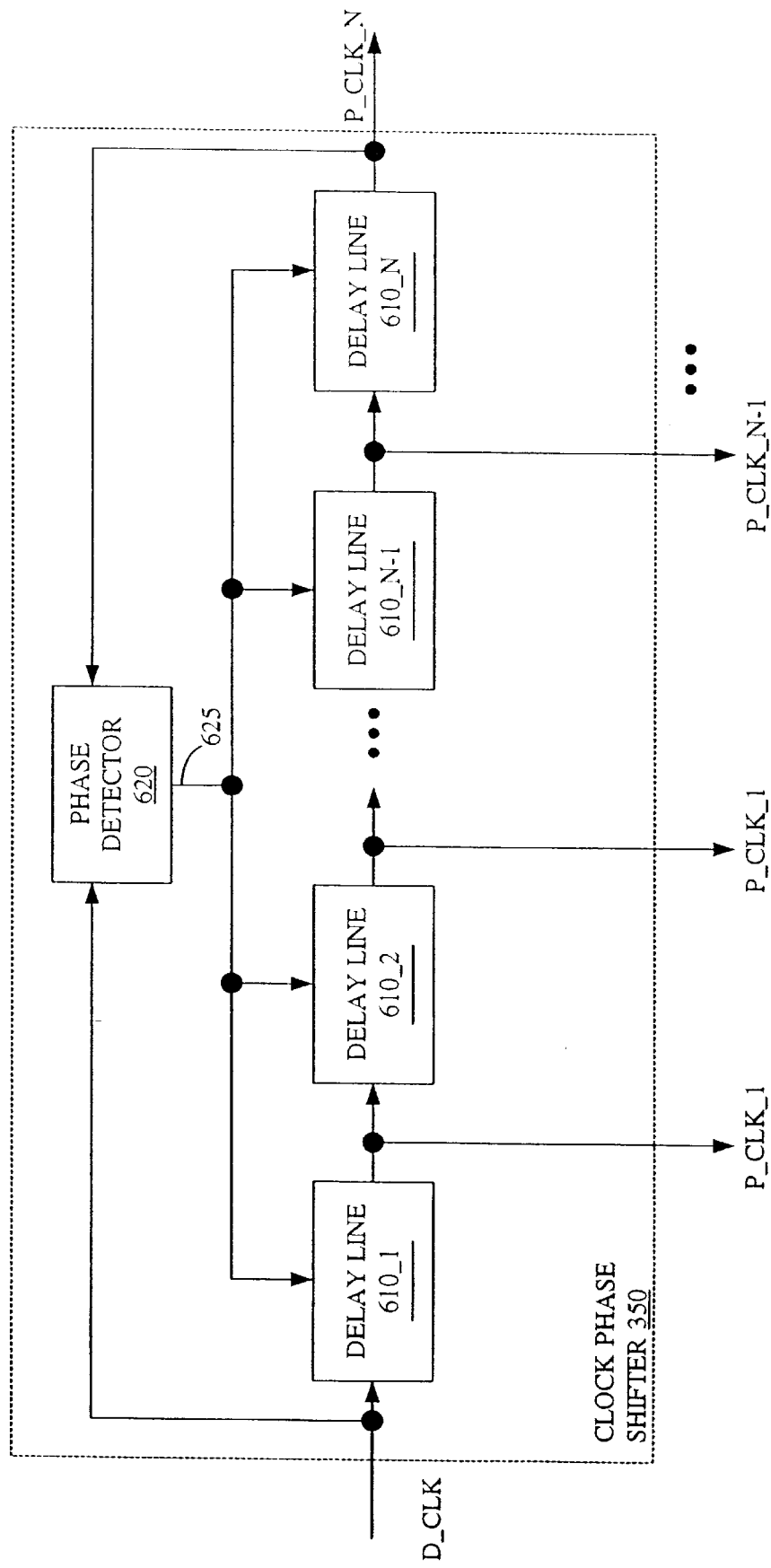
FIG. 6 is a block diagram of an embodiment of a clock phase shifter in accordance with the present invention.

FIG. 6 illustrates one embodiment of clock phase shifter 350 of FIG. 3. The embodiment of clock phase shifter 350 in FIG. 6 comprises a phase detector 620 and a plurality of delay lines 610_1 to 610_N. Delay lines 610_1 to 610_N are coupled in series. The input terminal of delay line 610_1 receives an input clock signal such as delayed clock signal D_CLK (FIG. 3). The output terminal of delay line 610_N is coupled to an input terminal of phase detector 620. Phase detector 620 also receives input clock signal D_CLK on another input terminal. Phase detector 620 controls all the delay lines in parallel via control line 625, and each delay line provides the same amount of propagation delay. Consequently, input clock signal D_CLK and the clock signal P_CLK-N on the output terminal of delay line 610_N are synchronized, i.e., in phase. Further, phase detector 620 causes the total propagation delay generated by delay lines 610_1 to 610_N to be equal to one period P of the input clock. Thus, each delay line provides a propagation delay of P/N. Thus, the output terminal of delay line 610_1 provides a clock signal that is delayed from the input clock signal by P/N whereas the output terminal of delay line 610_2 provides a clock signal that is delayed from the input clock signal by 2*P/N. In general, the output terminal of delay line 610_Z provides a clock signal that is delayed from the input clock signal by Z*P/N, where Z is an integer between 1 and N-1, inclusive. Accordingly, if the input clock signal is delayed clock signal D_CLK, the output terminals of delay lines 610_1 to 610_N-1 provide phase-shifted clock signals P_CLK_1 to P_CLK_N-1, respectively. Some embodiments of clock phase shifter 350 also generate a clock signal P_CLK_N on the output terminal of delay line 610_N that has the same phase as delayed clock signal D_CLK.

Figure 7:
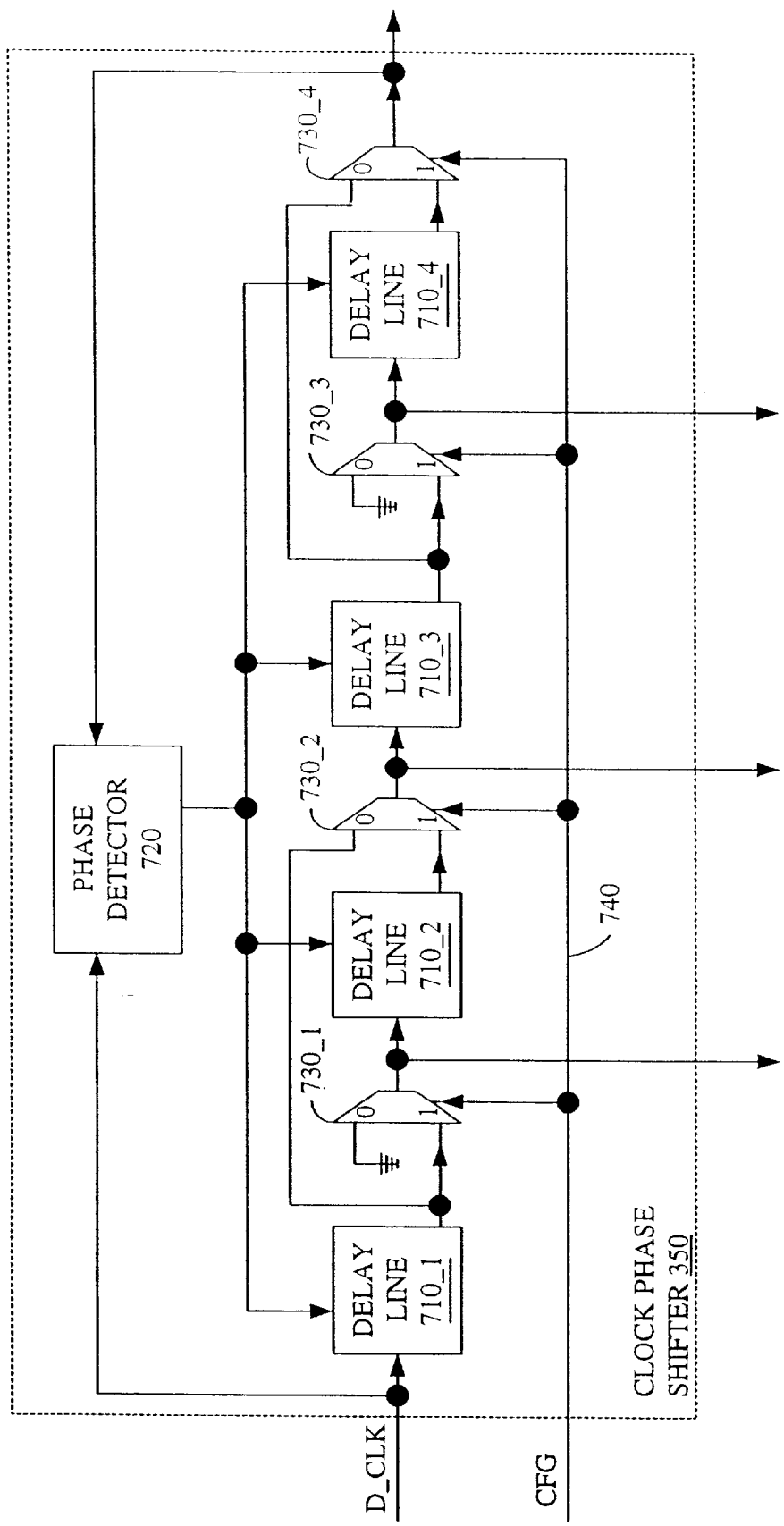
FIG. 7 is a block diagram of another embodiment of a clock phase shifter in accordance with the present invention.

FIG. 7 shows a configurable embodiment of clock phase shifter 350 of FIG. 3. Specifically, the clock phase shifter of FIG. 7 can be configured in a first mode to produce three phase-shifted clock signals that are 90 degrees, 180 degrees, and 270 degrees out of phase with an input clock signal. In a second mode, the clock phase shifter of FIG. 7 produces a single phase-shifted clock signal that is 180 degrees out of phase with the input clock signal. The clock phase shifter of FIG. 7 comprises a phase detector 720, delay lines 710_1, 710_2, 710_3, and 710_4, and multiplexers 730_1, 730_2, 730_3, and 730_4. A configuration line 740 is coupled to the select terminal of multiplexers 730_1 to 730_4.

The input terminal of delay line 710_1 is coupled to receive an input clock signal such as delayed clock signal D_CLK (FIG. 3). The output terminal of each delay line 710_Z is coupled to the logic one input terminal of multiplexer 730_Z, where Z is an integer between 1 and 3, inclusive. The output terminal of each multiplexer 730_z is coupled to the input terminal of delay line 710_Z+1, where Z is an integer between 1 and 3, inclusive. The output terminal of multiplexer 730_4 is coupled to an input terminal of phase detector 720. The logic zero input terminals of multiplexer 730_1 and multiplexer 730_3 are coupled to ground. However, the logic zero input terminal of multiplexer 730_2 is coupled to the output terminal of delay line 710_1. Similarly, the logic zero input terminal of multiplexer 730_4 is coupled to the output terminal of delay line 710_3. Phase detector 720 also receives input clock signal D_CLK on another input terminal. Phase detector 720 controls delay lines 710_1 to 710_4 in parallel as described above with respect to phase detector 620.

If configuration line 740 is pulled to logic one, which puts the embodiment of FIG. 7 into the first mode, delay lines 710_1 to 710_4 are coupled in series. In the first mode, each delay line provides a delay of P/4. Thus, if the input clock signal is delayed clock signal D_CLK, the output terminal of each multiplexer 730_Z can provide phase-shifted clock signals P_CLK_1, P_CLK_2, and P_CLK_3.

However, if configuration line 740 is pulled to logic zero, which puts the embodiment of FIG. 7 into the second mode, only delay lines 710_1 and 710_3 are coupled in series. Delay lines 710_2 and 710_4 have their input terminal coupled to ground through multiplexers 730_1 and 730_3, respectively. In the second mode delay lines 710_1 and 710_3 each provide a delay of P/2. Coupling the input terminals of delay lines 710_2 and 710_4 to ground reduces power consumption and switching noise. However, in the second mode the embodiment of FIG. 7 produces only one output clock signal, which is 180 degrees out of phase with the input clock signal and is generated at the output terminal of multiplexer 730_2.

Figure 8:
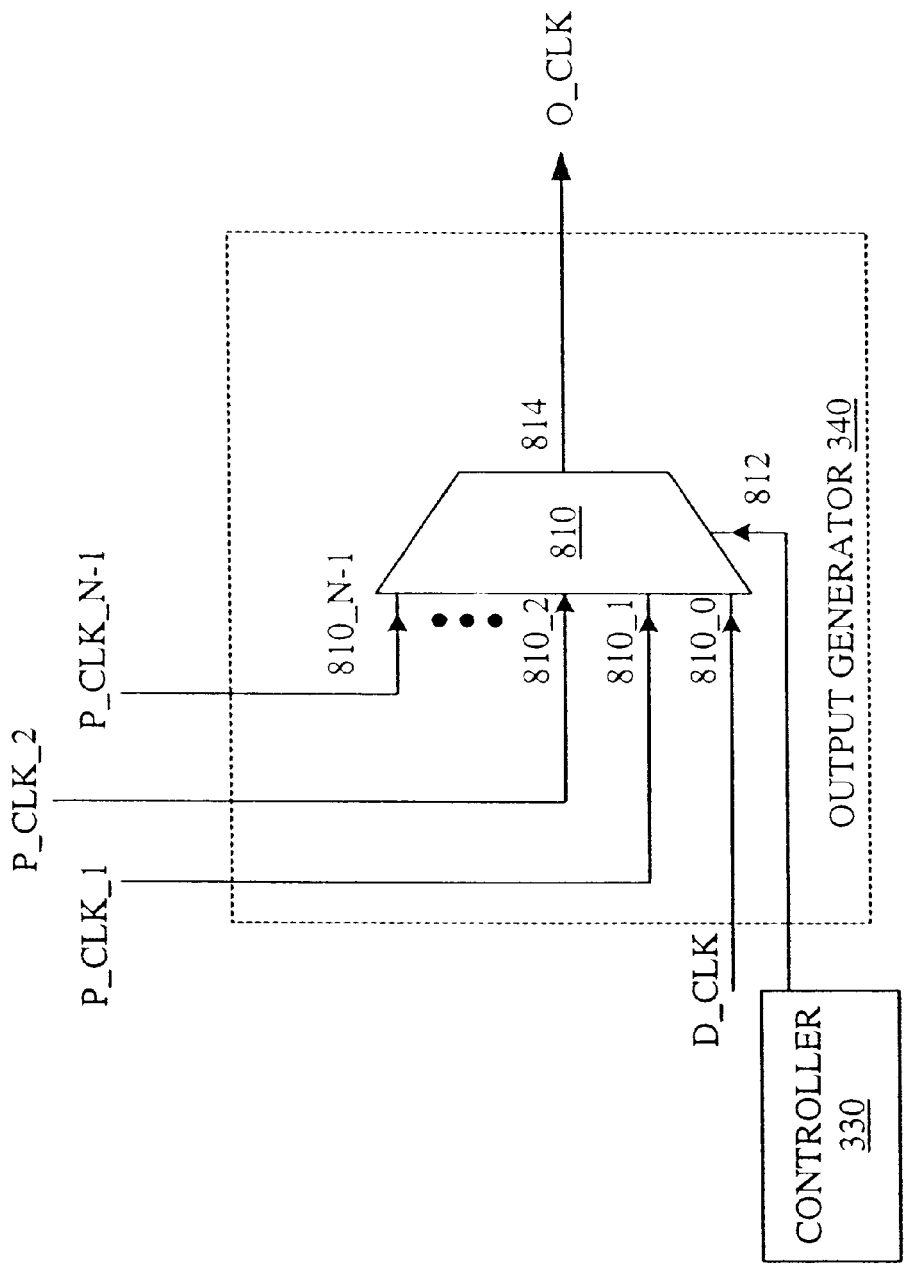
FIG. 8 is a block diagram of an output generator in accordance with the present invention.

FIG. 8 shows one embodiment of output generator 340 of FIG. 3. The output generator of FIG. 8 comprises an N-input multiplexer 810. N-input multiplexer 810 has N input terminals, referenced as 810_0 to 810_N-1, select terminals 812, and an output terminal 814. When the embodiment of output generator 340 of FIG. 8 is used in delay lock loop 300 of FIG. 3, select terminals 812 are coupled to controller 330, input terminal 810_0 is coupled to receive delayed clock signal D_CLK, output terminal 814 provides output clock signal O_CLK, and input terminals 810_1 to 810_N-1 are coupled to receive phase-shifted clock signals P_CLK_1 to P_CLK_N-1, respectively. Select signals on select terminals 812 determine which input signal is provided on output terminal 814. Other embodiments of output generator 340 may include additional circuitry, such as clock buffers and clock dividers. In addition, some embodiments of output generator 340 drive additional clock signals, such as various versions of the phase-shifted clock signals.

Figure 9:
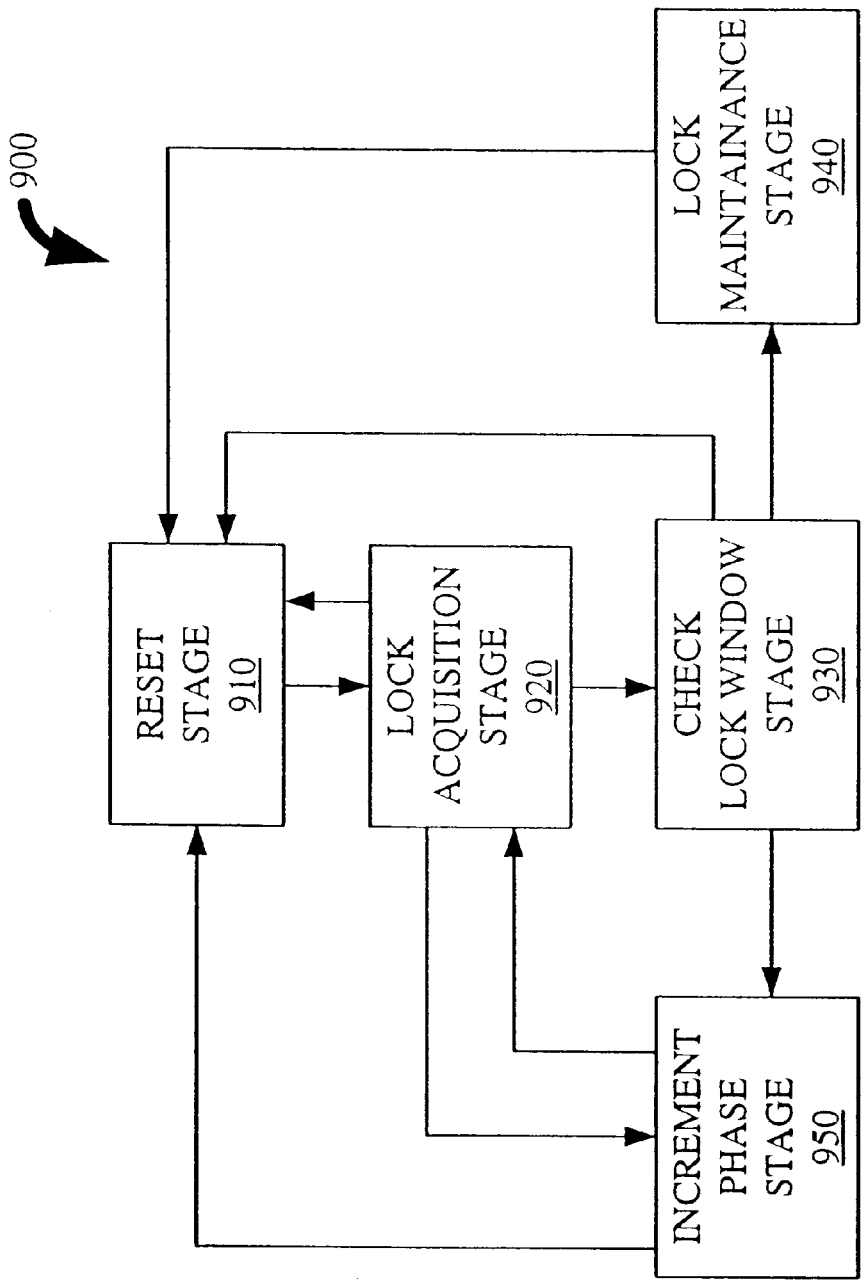
FIG. 9 is a state diagram for an embodiment of a controller in accordance with the present invention.

FIG. 9 shows a state diagram 900 for one embodiment of controller 330 of FIG. 3. On power-up or reset, controller 330 transitions to reset stage 910. In reset stage 910, controller 330 sets a phase counter (not shown) to zero, which causes output generator 340 to provide delayed clock signal D_CLK as output clock signal O_CLK, and adjusts propagation delay D of delay line 310 (FIG. 3) to a starting delay value. Starting delay values for propagation delay D include, for example, minimum propagation delay D_MIN, maximum propagation delay D_MAX, or the average of minimum propagation delay D_MIN and maximum propagation delay D_MAX. Controller 910 then transitions to lock acquisition stage 920.

In lock acquisition stage 920, controller 330 synchronizes reference clock signal REF_CLK and skewed clock signal S_CLK. Specifically, controller 330 adjusts propagation delay D of delay line 310 based on signals from phase detector 320. Phase detector 320 determines whether propagation delay D must be increased or decreased to synchronize skewed clock signal S_CLK with reference clock signal REF_CLK. Lock acquisition is described above in greater detail with respect to FIGS. 3–6; therefore, the description is not repeated. In some embodiments, clock phase shifter 350 is also reset by the power-on/reset signal. For some of these embodiments, controller 330 does not adjust propagation delay D until after clock phase shifter 350 produces phase-shifted clock signals P_CLK_1 to P_CLK_N−1. If controller 330 cannot synchronize skewed clock signal S_CLK with reference clock signal REF_CLK, controller 330 transitions to increment phase stage 950, described below. Otherwise, controller 330 transitions to check lock window stage 930 after controller 330 synchronizes skewed clock signal S_CLK with reference clock signal REF_CLK (with an initial propagation delay ID in delay line 310).

In check lock window stage 930, controller 330 must determine whether initial propagation delay ID is within lock window W. Specifically, propagation delay ID is within lock window W if propagation delay ID is greater than lock window minimum W_MIN and less than lock window maximum W_MAX. If initial propagation delay ID is not within lock window W, controller 330 transitions to increment phase stage 950. Otherwise, controller 330 transitions to lock maintenance stage 940.

In lock maintenance stage 940, controller 330 adjust propagation delay D of delay line 310 to maintain synchronization of skewed clock signal S_CLK with reference clock signal REF_CLK. Lock maintenance is described above in greater detail; therefore, the description is not repeated. As described above, the present invention can maintain lock throughout the systems environment conditions. Therefore, controller 330 remains in lock maintenance stage 940 unless a reset occurs that causes controller 330 to transition to reset stage 910.

In increment phase stage 950, controller 330 increments the phase counter, which causes output generator 340 to select a different phase-shifted clock signal. Further, controller 330 resets delay line 310 so that propagation delay D returns to the starting delay value used in reset stage 910. Controller 330 then transitions to lock acquisition stage 920 and proceeds as described above.

Figure 10:
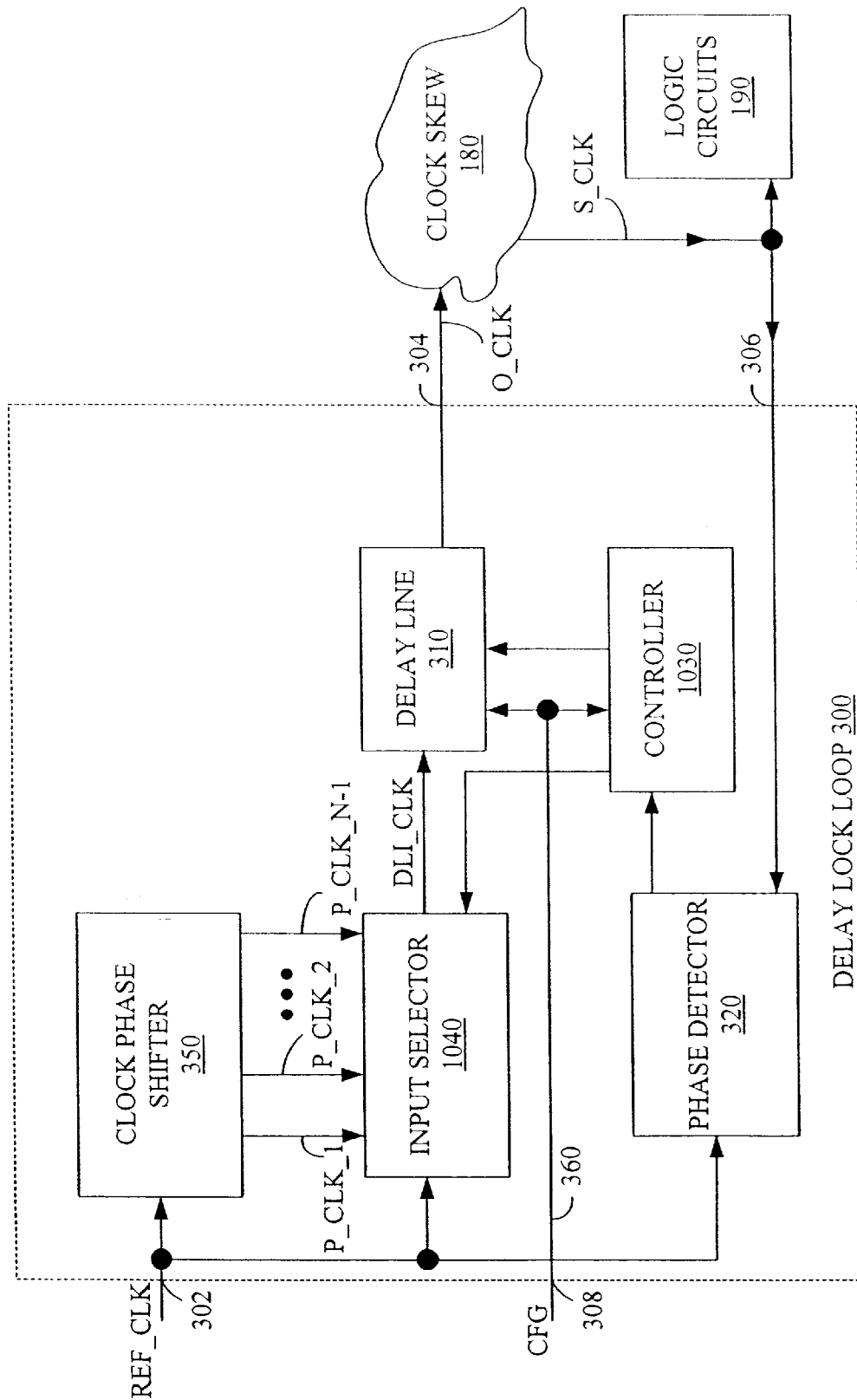
FIG. 10 is a block diagram of a system using another embodiment of a delay lock loop in accordance with the present invention.

FIG. 10 is a block diagram of another embodiment of delay lock loop 300. The embodiment of FIG. 10 uses the same principles as described above with respect to the embodiment of FIG. 3. However, in the embodiment of FIG. 10, clock phase shifter 350 generates phase-shifted clock signals P_CLK_1 to P_CLK_N−1 using reference clock signal REF_CLK. Reference clock signal REF_CLK and phase-shifted clock signals P_CLK_1 to P_CLK_N−1 are coupled to an input selector 1040. Input selector 1040 selects either reference clock signal REF_CLK or one of phase-shifted clock signals P_CLK_1 to P_CLK_N−1 as a delay line input clock signal DLI_CLK, which is provided to the input terminal of delay line 310. Delay line 310 drives output clock signal O_CLK. A controller 1030 controls input selector 1040 and delay line 310 based on the phase information provided by phase detector 320 so that delay line 310 provides a propagation delay D that synchronizes skewed clock signal S_CLK with reference clock signal REF_CLK. Input selector 1040 can be implemented using the same circuit design as output generator 340.

In the various embodiments of the present invention, novel structures have been described for delay lock loops. By using a clock phase shifter to provide propagation delays proportional to the period of a clock signal, the present invention can provide clock signal control of the initial propagation delay at lock acquisition. By accepting only initial propagation delays within a lock window, the present invention can maintain synchronization of the clock signals over the entire range of environmental conditions of a system using the present invention. Further, since the clock phase shifter provides propagation delays proportional to the period of the clock signal, the present invention is applicable to systems using both high and low frequency clock signals. In addition, the delay lock loop of the present invention can be implemented with purely digital circuits that can be completely incorporated on a single silicon chip such as an FPGA, a DSP chip, or a microprocessor.

Figure 11:
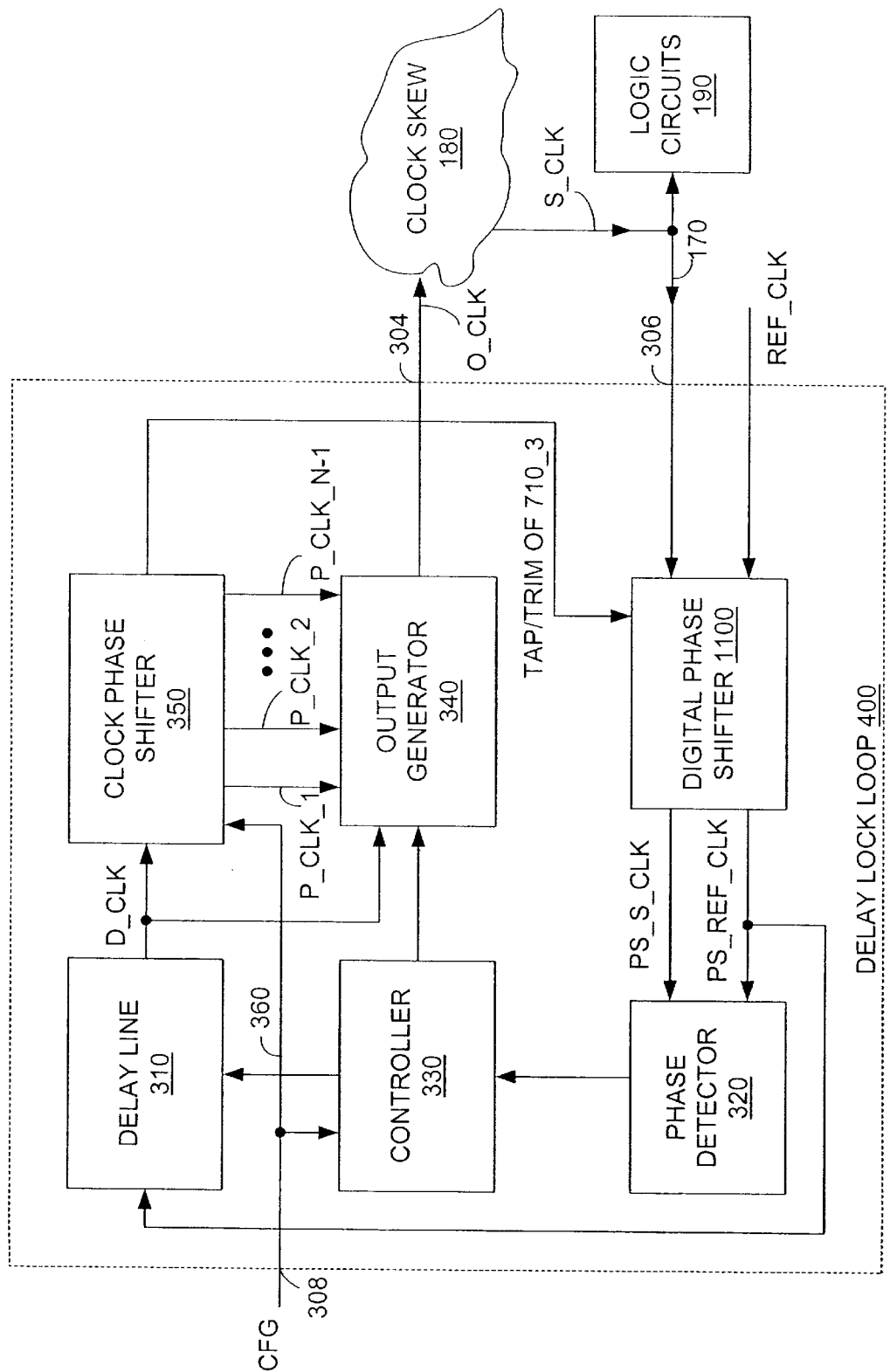
FIG. 11 is a block diagram of a delay lock loop, which can be used in place of the delay lock loop of FIG. 3, in accordance with another embodiment of the present invention.

FIG. 11 is a block diagram of a delay lock loop 400, which can be used in place of delay lock loop 300, in accordance with another embodiment of the present invention. Because delay lock loop 400 (FIG. 11) is similar to delay lock loop (FIG. 3), similar elements in FIGS. 3 and 11 are labeled with similar reference numbers. Thus, delay lock loop 400 includes delay line 310, phase detector 320, controller 330, output generator 340, and clock phase shifter 350. In addition, delay lock loop 400 includes digital phase shifter 1100, which enables the skew clock signal S_CLK to have a leading or lagging relationship with respect to the reference clock signal REF_CLK.

Within delay lock loop 400, both the reference clock signal REF_CLK and the skew clock signal S_CLK are applied to input terminals of digital phase shifter 1100. In response, digital phase shifter 1100 provides phase shifted reference clock signal PS_REF_CLK and phase shifted feedback clock signal PS_S_CLK. The phase shifted reference clock signal PS_REF_CLK is provided to input terminals of delay line 310 and phase detector 320. Thus, the PS_REF_CLK signal of delay lock loop 400 is routed in the same manner as the reference clock signal REF_CLK of delay lock loop 300. The phase shifted feedback clock signal PS_S_CLK is provided to an input terminal of phase detector 320. Thus, the PS_S_CLK signal of delay lock loop 400 is routed in the same manner as the skew clock signal S_CLK of delay lock loop 300.

As described in more detail below, digital phase shifter 1100 adjusts the phase relationship of the REF_CLK and S_CLK signals to provide the PS_REF_CLK and PS_S_CLK signals, respectively. As a result, the S_CLK signal can be controlled to have a leading or lagging phase relationship with respect to the REF_CLK signal.

Figure 12:
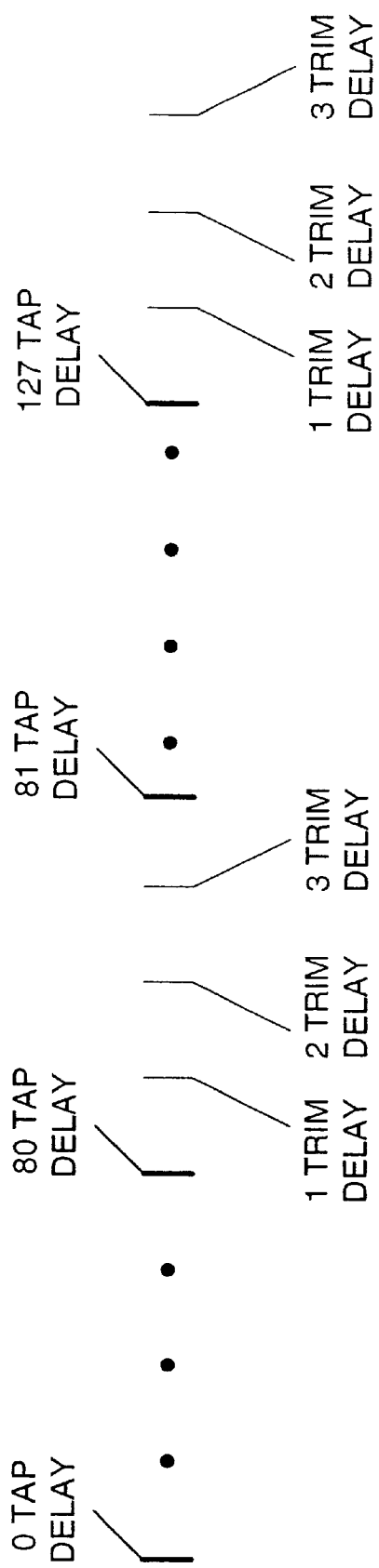
FIG. 12 is a schematic diagram illustrating the tap/trim delays for selected sections of a delay line in the clock phase shifter of FIG. 7.

In the described embodiment, clock phase shifter 350 is configured in the manner illustrated in FIG. 7 (i.e., N=4). Each of the delay lines 710_1, 710_2, 710_3 and 710_4 includes 128 tap delays and a trim delay circuit. The trim delay circuit can be controlled to add up to 3 trim delays between tap delays. Delay line 710_3 therefore has 512 (128+3*128) possible tap/trim delay settings. FIG. 12 illustrates the tap/trim delays for selected sections of delay line 710_3. Circuitry for providing the tap/trim delays is described in commonly owned, U.S. Pat. No. 6,400,735 B1 issued on Jun. 4, 2002, entitled "Glitchless Delay Line Using Gray Code Multiplexer" by Andrew K. Percey, which is incorporated herein by reference.

Phase detector 720 controls each of the delay lines 710_1, 710_2, 710_3 and 710_4 to have the same tap/trim setting (+/−1 trim delay). When the configuration signal CFG has a logic "1" value (i.e., delay lock loop 400 is configured in a low frequency mode), all four of the delay lines 710_1, 710_2, 710_3 and 710_4 are coupled in series. As a result, the delay selected by the tap/trim setting of each of the delay lines corresponds with approximately one-quarter cycle of the D_CLK signal.

Similarly, when the configuration signal CFG has a logic "0" value (i.e., delay lock loop 400 is configured in a high frequency mode), the two delay lines 710_1 and 710_3 are coupled in series. As a result, the delay selected by the tap/trim setting of each of the delay lines 710_1 and 710_3 corresponds with approximately one-half cycle of the D_CLK signal.

Clock phase shifter 350 provides the tap/trim setting of delay line 710_3 to digital phase shifter 1100, thereby providing digital phase shifter 1100 with a signal that corresponds with the period of the D_CLK signal. As described in more detail below, this information is used to select the phase shift introduced by digital phase shifter 1100.

Figure 13:
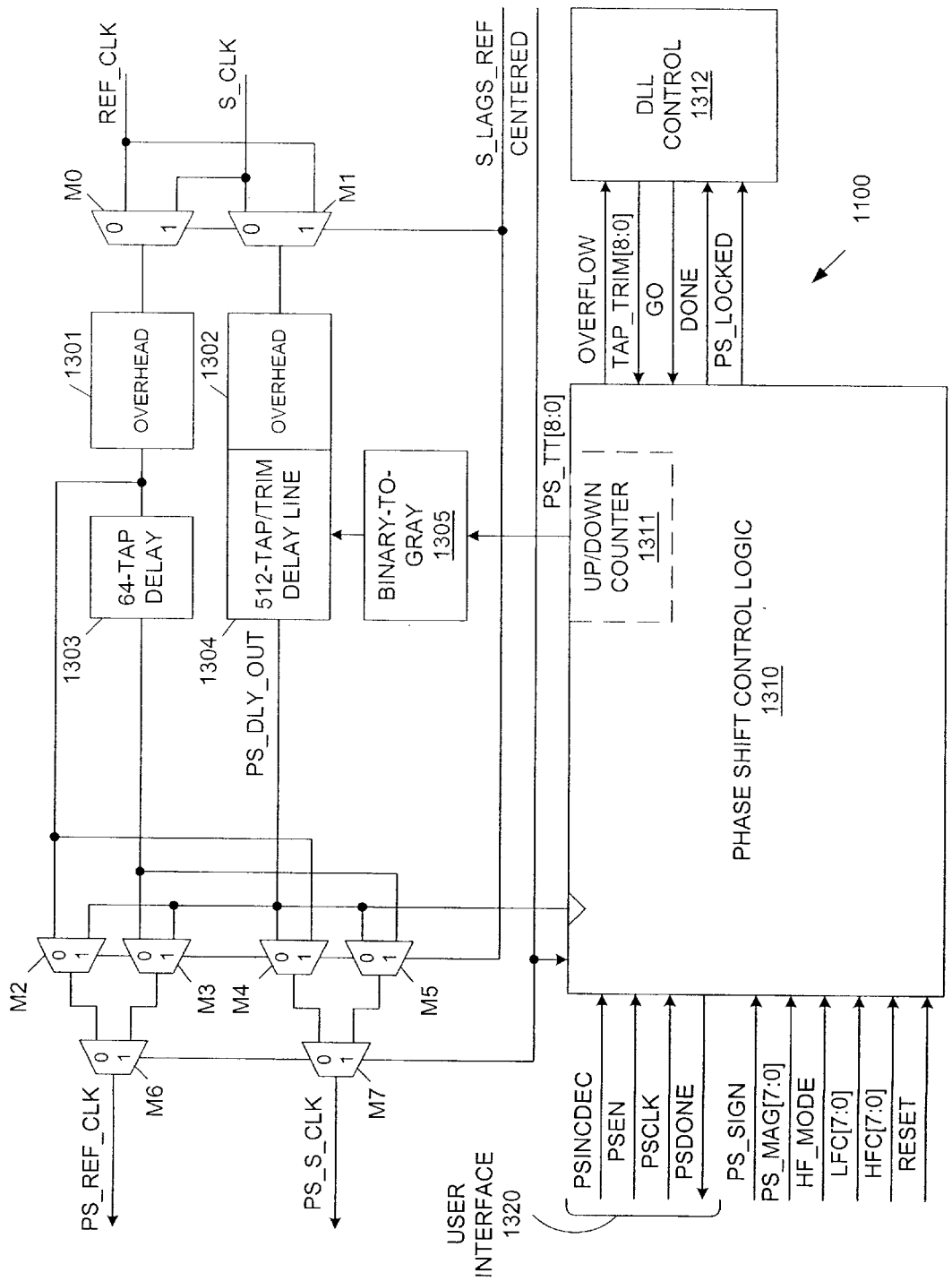
FIG. 13 is a block diagram of a digital phase shifter in accordance with one embodiment of the present invention.

FIG. 13 is a block diagram of digital phase shifter 1100 in accordance with one embodiment of the present invention. Digital phase shifter 1100 includes multiplexers M0–M7, overhead delay circuits 1301–1302, 64-tap delay circuit 1303, adjustable 512-tap/trim delay line 1304, binary-to-gray decoder 1305, phase shift control logic 1310 (which includes up/down counter 1311) and DLL control circuitry 1312.

Digital phase shifter 1100 is controlled as follows. First, digital phase shifter 1100 is selected to operate in one of four modes. These four modes include a first fixed mode, a second fixed mode, a first variable mode and a second variable mode. In the first fixed mode, digital phase shifter 1100 introduces delay to the skew clock signal. For example, digital phase shifter 1100 can be controlled to introduce a delay in the range of 0 to 511 tap/trim units to the skew clock signal in the first fixed mode. In the second fixed mode, digital phase shifter 1100 introduces delay to the reference clock signal. For example, digital phase shifter 1100 can be controlled to introduce a delay in the range of 0 to 511 tap/trim units to the reference clock signal in the second fixed mode. In the first variable mode, digital phase shifter 1100 can be controlled to introduce a delay equal to 255 to −255 tap/trim units to the reference clock signal. In the second variable mode, digital phase shifter 1100 can be controlled to introduce a delay equal to 255 to −255 tap/trim units to the skew clock signal.

The mode is selected in response to the S_LAGS_REF and CENTERED control signals. The CENTERED control signal is de-asserted low, and the S_LAGS_REF signal is de-asserted low to indicate that the S_CLK signal will lead the REF_CLK signal in the first fixed mode. Conversely, the CENTERED control signal is de-asserted low, and the S_LAGS_REF signal is asserted high to indicate that the S_CLK signal will lag the REF_CLK signal in the second fixed mode. The CENTERED control signal is asserted high and the S_LAGS_REF signal is asserted high to enable the first variable mode. The CENTERED control signal is asserted high and the S_LAGS_REF signal is de-asserted low to enable the second variable mode. In one embodiment, these control signals are provided by configuration memory bits of a programmable logic device, although this is not necessary.

Figure 14A:
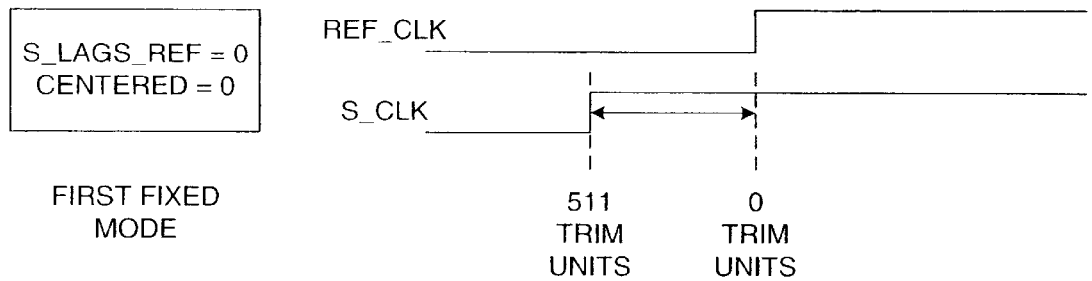
FIGS. 14A and 14B are waveform diagrams illustrating reference clock and skew clock signals for a first fixed mode and a second fixed mode, respectively, of the delay lock loop of FIG. 11.

FIG. 14A is a waveform diagram illustrating the REF_CLK and S_CLK signals for the first fixed mode. To enter the first fixed mode, the S_LAGS_REF control signal is de-asserted to a logic "0" state, and the CENTERED control signal is de-asserted to a logic "0" state. Under these conditions, the REF_CLK signal is routed through multiplexers M0, M2 and M6 and overhead delay circuit 1301 to provide the PS_REF_CLK signal. The S_CLK signal is routed through multiplexers M1, M4 and M7, overhead delay circuit 1302 and 512-tap/trim delay line 1304 to provide the PS_S_CLK signal. Overhead delay circuits 1301 and 1302 introduce the same delay to the applied signals. Thus, if the 512-tap/trim delay line 1304 is set to have zero delay, then the REF_CLK signal and the S_CLK signal will have identical delays through digital phase shifter 1100.

Delay lock loop 400 will always cause the PS_REF_CLK and the PS_S_CLK signals to be synchronized. As a result, any phase shifting introduced by delay elements 1301–1304 is realized by the REF_CLK and S_CLK signals. In the first fixed mode, if the delay introduced by 512-tap/trim delay line 1304 is increased, then the REF_CLK signal will lag the S_CLK signal. The 512-tap/trim delay line 1304, which is identical to delay line 710_3 (FIG. 7), can be configured to provide a maximum tap/trim delay of 511 trim units (thereby providing a maximum lag for the REF_CLK signal).

Figure 14B:
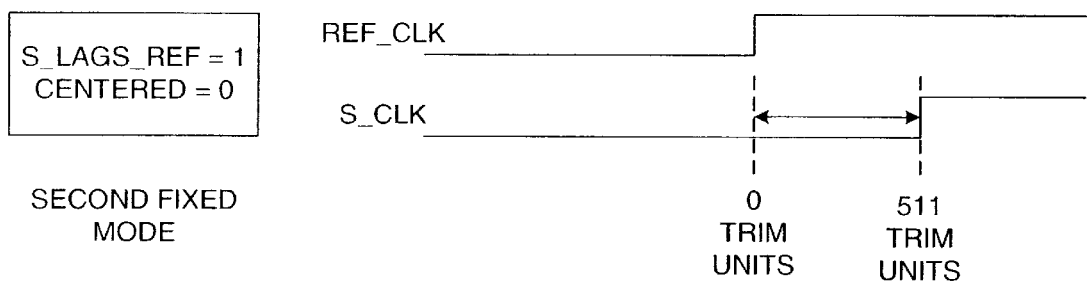

FIG. 14B is a waveform diagram illustrating the REF_CLK and S_CLK signals for the second fixed mode. To enter the second fixed mode, the S_LAGS_REF control signal is asserted to a logic "1" state, and the CENTERED control signal is de-asserted to a logic "0" state. Under these conditions, the REF_CLK signal is routed through multiplexers M1, M2 and M6, overhead delay circuit 1302 and 512-tap/trim delay line 1304 to provide the PS_REF_CLK signal. The S_CLK signal is routed through multiplexers M0, M4 and M7 and overhead delay circuit 1301 to provide the PS_S_CLK signal. If the 512-tap/trim delay line 1304 is set to have zero delay, then the REF_CLK signal and the S_CLK signal will have identical delays through digital phase shifter 1100.

In the second fixed mode, if the delay introduced by 512-tap/trim delay line 1304 is increased, then the REF_CLK signal will begin to lead the S_CLK signal. When the 512-tap/trim delay line 1304 is configured to provide a maximum tap/trim delay of 511 trim units, a maximum phase lead will be provided for the REF_CLK signal.

Figure 14C:
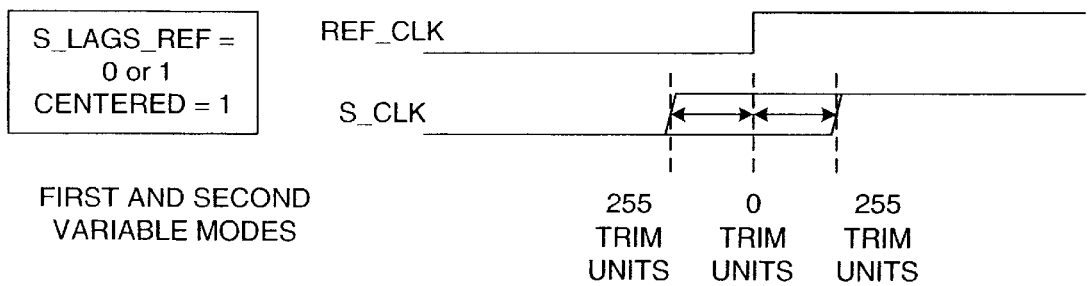
FIG. 14C is a waveform diagram illustrating reference clock and skew clock signals for a first and second variable mode of the delay lock loop of FIG. 11.

FIG. 14C is a waveform diagram illustrating the REF_CLK and S_CLK signals for the first and second variable modes. To enter the first variable mode, the CENTERED control signal is asserted to a logic "1" state and the S_LAGS_REF control signal is asserted to a logic "1" state. As a result, the REF_CLK signal is routed through multiplexers M1, M3 and M6, overhead delay circuit 1302 and 512-tap/trim delay line 1304 to provide the PS_REF_CLK signal. The S_CLK signal is routed through multiplexers M0, M5 and M7, overhead delay circuit 1302 and 64-tap delay line 1303. The 64-tap delay circuit 1303 provides a fixed delay equal to half of the maximum delay of 512-tap/trim delay line 1304 (or delay line 710_3). The 512-tap/trim delay line 1304 is initially set to a delay equal to zero trim units, and is incremented to a delay equal to 64-taps (256 trim units). At this time, the delays through delay circuits 1303 and 1304 are initially matched (i.e., there is a zero phase shift). The delay introduced by the 512-tap/trim delay line 1304 can be increased greater than the 64 tap delay, thereby causing the S_CLK signal to lag the REF_CLK signal. Conversely, the delay introduced by the 512-tap/trim delay line 1304 can be reduced to less than the 64 tap delay, thereby causing the S_CLK signal to lead the REF_CLK signal. Because zero phase shift is obtained at the mid-point of delay line 1304 (i.e., at 256 trim units), this delay line 1304 can only provide an additional 255 trim units of delay in each direction in the first variable mode.

FIG. 14C also represents the REF_CLK and S_CLK signals for the second variable mode. To enter the second variable mode, the CENTERED control signal is asserted to a logic "1" state and the S_LAGS_REF control signal is asserted to a logic "0" state. As a result, the REF_CLK signal is routed through multiplexers M0, M3 and M4, overhead delay circuit 1301 and 64-tap delay line 1303 to provide the PS_REF_CLK signal. The S_CLK signal is routed through multiplexers M1, M6 and M7, overhead delay circuit 1301 and 512-tap/trim delay line 1304. The 512-tap/trim delay line 1304 is initially set to a delay equal to zero trim units, and is incremented to a delay equal to 64-taps (256 trim units). At this time, the delays through delay circuits 1303 and 1304 are initially matched (i.e., there is a zero phase shift). The delay introduced by the 512-tap/trim delay line 1304 can be increased greater than the 64 tap delay, thereby causing the S_CLK signal to lead the REF_CLK signal. Conversely, the delay introduced by the 512-tap/trim delay line 1304 can be reduced to less than the 64 tap delay, thereby causing the S_CLK signal to lag the REF_CLK signal. The second variable mode is similar to the first variable mode. However, in the first variable mode, 512-tap/trim delay line 1304 is in line with the REF_CLK signal, and in the second variable mode, the 512-tap/trim delay line 1304 is in line with the S_CLK signal. In the described embodiments, the first variable mode is preferred for the following reason. If the 512-tap/trim delay line 1304 is in line with the S_CLK signal, then delay line 310 will subsequently need to compensate for adjustments made by delay line 1304, thereby reducing the number of available tap adjustments remaining in delay line 310.

Delay lock loop 400 operates as follows in accordance with one embodiment of the present invention.

Initially, configuration memory bits are set to define the states of the S_LAGS_REF and CENTERED control signals, thereby defining whether digital phase shifter 1100 will operate in the first fixed mode (REF_CLK lagging S_CLK), the second fixed mode (REF_CLK leading S_CLK) or the first or second variable mode.

Configuration memory bits are also set to define the states of the PS_SIGN, PS_MAG[7:0], HF_MODE, LFC and HFC control signals. The PS_MAG[7:0] control signal identifies the magnitude of the phase shift to be introduced by digital phase shifter 1100. The PS_SIGN control signal is used to identify the polarity of the PS_MAG[7:0] signal when digital phase shifter 1100 is configured in the variable mode (i.e., CENTERED=1). When digital phase shifter 1100 is configured in a fixed mode, the PS_SIGN control signal is not used. If the PS_SIGN signal has a logic "1" state (indicating a negative polarity), the PS_MAG[7:0] signal cannot have a logic 0 value, because the PS_MAG[7:0] signal is represented in 2's complement in the present embodiment.

The HF_MODE control signal is set to a logic "0" value when digital phase shifter 100 is operating in response to low frequency clock signals, where all four delay lines 710_1–710_4 are required to create one full period. Conversely, the HF_MODE control signal is set to a logic "1" value when digital phase shifter 1100 is operating in response to high frequency clock signals, where only two delay lines 710_1 and 710_3 are sufficient to create one full period. The HF_MODE control signal is used to select a low frequency mode constant LFC[7:0] or a high frequency mode constant HFC[7:0].

The low frequency mode constant LFC[7:0] represents the overhead of the signal path in trim units through the delay chain located in clock phase shifter 350 (FIG. 7), when the CFG signal has a logic "1" value and all of the tap/trim settings in delay lines 710_1–710_4 are set to zero.

Similarly, the high frequency mode constant HFC[7:0] represents the overhead of the signal path in trim units through the delay chain located in clock phase shifter 350 (FIG. 7), when the CFG signal has a logic "0" value and all of the tap/trim settings in delay lines 710_1 and 710_3 are set to zero. The low frequency mode constant LFC[7:0] and the high frequency mode constant HFC[7:0] are determined by Spice simulation in the described embodiment.

After the above-described constants have been set, the RESET signal is asserted, thereby resetting up/down counter 1311 to a value corresponding with zero tap/trim delay in delay line 1304. Delay line 310 is also set to a value corresponding with zero tap/trim delay. These settings are maintained until after clock phase shifter 350 achieves a locked condition. More specifically, the REF_CLK signal is routed through digital phase shifter 1100 and delay line 310, and is provided to clock phase shifter 350 (as the D_CLK signal). In response, clock phase shifter 350 operates in the manner described above in connection with FIG. 7 to achieve a locked condition with respect to the REF_CLK signal. Note that digital phase shifter 1100 and delay line 310 are prevented from adjusting their delay lines while clock phase shifter 350 is locking using the REF_CLK signal. After clock phase shifter 350 has achieved a locked condition, the tap/trim setting of delay line 710_3 is representative of either ¼ of the period (low frequency mode) or ½ of the period (high frequency mode) of the reference clock signal REF_CLK. At the end of this state, the tap/trim setting of delay line 710_3 is provided to phase shift control logic 1310 as the TAP_TRIM[8:0] signal. The RESET signal is de-asserted after the clock phase shifter 350 is locked.

After the RESET signal is de-asserted, digital phase shifter 1100 is allowed to adjust delay line 1304. However, while digital phase shifter 1100 is adjusting delay line 1304, clock phase shifter 350 and delay line 310 are prevented from adjusting their delay lines. Digital phase shifter 1100 increments counter 1311 to provide the initial setting of 512-tap/trim delay line 1304. The initial setting of 512-tap/trim delay line 1304 is calculated as a function of the TAP_TRIM[8:0] signal and the PS_SIGN and PS_MAG [6:0] values. Up/down counter 1311 is incremented (or decremented) until the count of this counter 1311 matches the calculated initial setting. This count is transparently passed to 512-tap/trim delay line 1304 through binary-to-gray code converter 1305. Binary-to-gray code converter is described in more detail in commonly owned U.S. Pat. No. 6,400,735 B1 issued on Jun. 4, 2002.

More specifically, the initial setting of 512-tap/trim delay line 1304 is determined by first determining an equivalent tap/trim per period (ETT/P). For low frequency mode, ETT/P is determined by the following equation.

$$ETT/P=(4\times(TAP\_TRIM[8:0]))+LFC[7:0] \tag{6}$$

For high frequency mode, ETT/P is determined by the following equation.

$$ETT/P=(2\times(TAP\_TRIM[8:0]))+HFC[7:0] \tag{7}$$

The initial setting of 512-tap/trim delay line 1304 is then determined from the ETT/P value in the following manner. For the first and second fixed modes of operation, the initial tap/trim setting of 512-tap/trim delay line 1304 is equal to:

$$(PS\_MAG[7:0]/256)\times ETT/P \tag{8}$$

For the first and second variable modes of operation, the initial tap/trim setting of 512-tap/trim delay line 1304 is equal to:

$$256+((PS\_MAG[7:0]/256) \times ETT/P);\qquad(9)$$

If PS_SIGN=0 or $$256-((PS\_MAG[7:0]/256) \times ETT/P);\qquad(10)$$

If PS_SIGN=1.

Because there is only one delay line 1304 in digital phase shifter 1100, the maximum value of PS_MAG[7:0]/256 is less than approximately ¼ and ½ of the longest period, for the low and high frequency modes, respectively.

After the initial tap/trim setting of 512-tap/trim delay line 1304 has been set, digital phase shifter 1100 and clock phase shifter 350 are temporarily prevented from adjusting their delay lines. At this time, delay line 310 is released, thereby enabling delay line 310 to be adjusted, such that the PS_REF_CLK and the PS_S_CLK signals are synchronized. That is, delay line 310 is allowed to achieve a locked condition. At this time, the S_CLK and REF_CLK signals exhibit a skew corresponding with the delay introduced by 512-tap/trim delay line 1304. In general processing continues in the above-described manner, such that during the next state, clock phase shifter 350 is allowed to lock, while delay line 1304 in digital phase shifter 1100 and delay line 310 are held at their previously determined values. During the next state, delay line 1304 of digital phase shifter 1100 is allowed to lock (using the TAP_TRIM[8:0] signal determined by clock phase shifter 350 during the previous state), while delay line 310 and the delay line in clock phase shifter 350 are held at their previously determined values. During the next state, delay line 310 is allowed to lock, while delay line 1304 of digital phase shifter 1100 and the delay line in clock phase shifter 350 are held at their previously determined values. By allowing only one of delay line 310, clock phase shifter 350 and digital phase shifter 1100 to adjust their delay lines at any given time, contention is prevented between delay line 310, clock phase shifter 350 and digital phase shifter 1100.

A more detailed description of the state machine used to control delay line 310, clock phase shifter 350 and digital phase shifter 1100 is provided in Appendix A.

As described above, the tap/trim setting of 512-tap/trim delay line 1304 is periodically recalculated, using the current TAP_TRIM[8:0] value provided by delay line 710_3 of clock phase shifter 350. Up/down counter 1311 is incremented, unchanged, or decremented, depending on whether the new TAP_TRIM[8:0] value is greater, the same or less than the old TAP_TRIM[8:0] value, respectively. As described above, a delay lock loop manager (not shown) ensures that delay line 310 and clock phase shifter 350 never check phase on a cycle that is temporarily extended or shortened by a trim change implemented within 512-tap/trim delay line 1304.

The tap/trim setting of delay line 1304 can also be modified by the user of delay lock loop 400 through a user interface 1320. User interface 1320 includes the phase increment/decrement signal PSINCDEC, the phase shift enable signal PSEN, the phase shift clock signal PSCLK and the phase shift done signal PSDONE, which are provided to phase shift control logic 1310. The PSCLK signal is different than the PS_DLY_OUT clock signal, thereby requiring the coordination of these two clock domains within phase shift control logic 1310. The PSEN signal is asserted high for one cycle of the PSCLK signal. At the same time, or prior to this cycle, the PSINCDEC signal is asserted high or low, thereby causing the numerator of the fraction in equations (8), (9) or (10) to be incremented or decremented by one, respectively. If the increment or decrement in the numerator is sufficient to warrant a change in the count value in up/down counter 1311, then this change is implemented. When digital phase shifter 1100 has completed the increment or decrement operation, phase shift control logic 1310 asserts the PSDONE signal for one cycle of the PSCLK signal, thereby indicating to the user that the tap/trim setting of delay line 1304 can be modified again.

Figure 15:
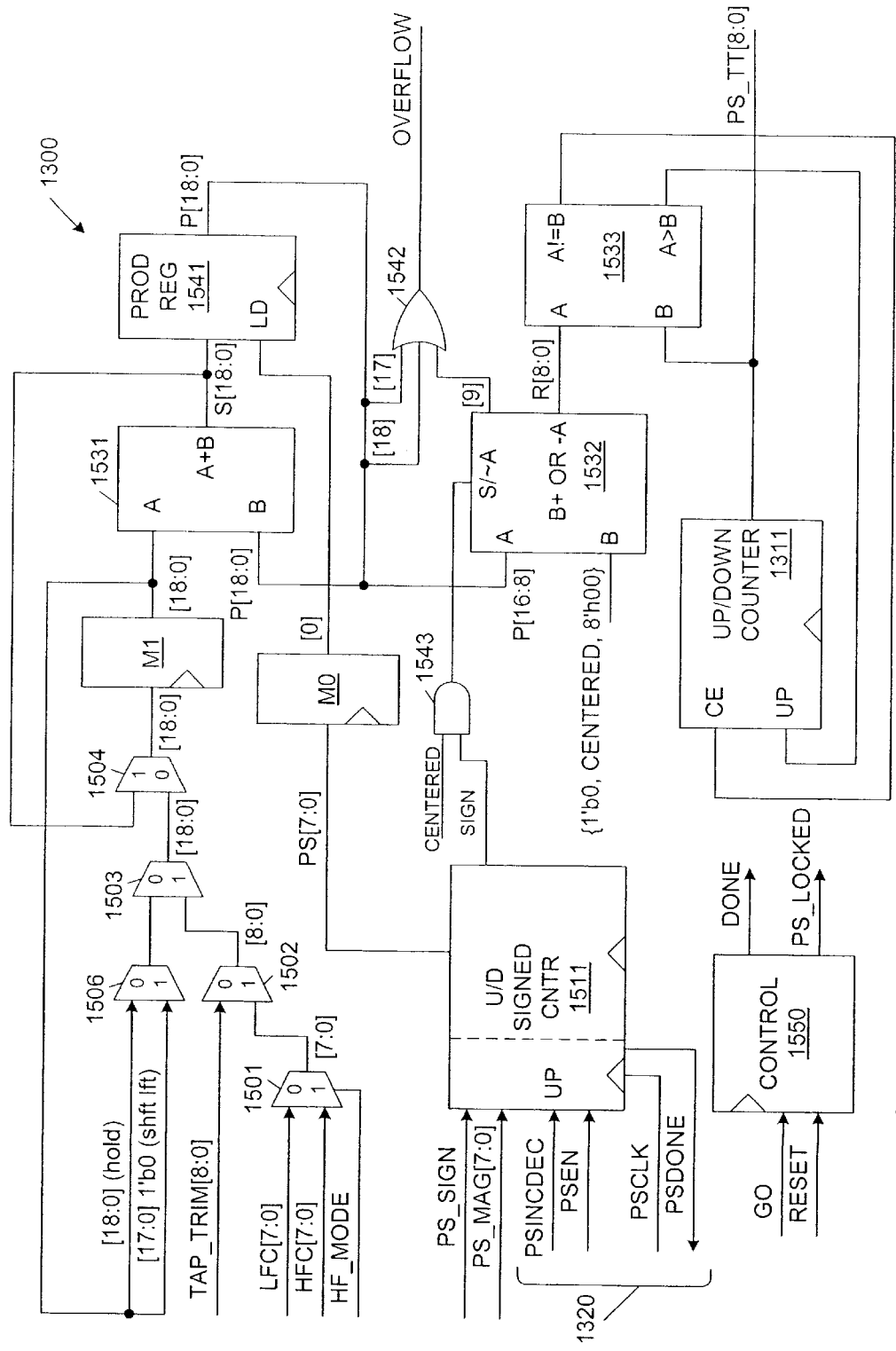
FIG. 15 is a block diagram illustrating phase shift control logic of FIG. 13 in more detail.

FIG. 15 is a block diagram illustrating phase shift control logic 1310 in more detail. In the described embodiment, phase shift control logic 1310 includes multiplexers 1501–1506, up/down signed counter 1511, registers M0–M1, adder 1531, bias adder/subtractor 1532, comparator block 1533, product register 1541, OR gate 1542, AND gate 1543, control block 1550 and up/down counter 1311.

Phase shift control logic 1310 performs the mathematics to convert the TAP_TRIM[8:0], LFC[7:0], HFC[7:0], PS_SIGN and PS_MAG[7:0] signals to the PS_TT[8:0] value, such that the phase shift delay introduced by delay line 1304 is the desired fractional part of the clock period. Phase shift control logic 1310 also includes a user interface 1320 that allows dynamic phase adjustments, and an interface to DLL control 1312.

DLL control 1312 specifies when phase shift control logic 1310 may change the PS_TT[8:0] signal. DLL control 1312 does this with an asynchronous 4 wave front hand shake cycle between the GO signal (a request from DLL control 1312) and the DONE signal (a response from phase shift control logic 1310).

The first GO signal asserted after the RESET signal causes the PS_TT[8:0] signal to increment from zero to the correct initial setting. On subsequent cycles, the PS_TT[8:0] signal is unchanged, increased, or decreased to maintain the correct delay (i.e., the currently specified fractional portion of the REF_CLK period).

A primary state machine of phase shift control logic 1310 remains dormant until the GO signal is received from DLL control 1312. After the GO signal is captured and synchronized to the local clock signal, this primary state machine is used to calculate the current PSTT[8:0] per equations (6)–(10) provided above. When the calculation and PS_TT update is completed, the DONE signal is activated to inform DLL control 1312 that the operation is complete. After the primary state machine is started, control proceeds to the next state after one clock cycle, unless otherwise noted. The various states of the primary state machine will now be described.

During an IDLE state, the PS_SIGN and PS_MAG[7:0] signals are loaded into up/down signed counter 1511. Signed counter 1511 provides the PS_SIGN signal as the SIGN signal, and the PS_MAG[7:0] signal as the PS[7:0] signal. The PS[7:0] signal is loaded into register M0.

In addition, the HF_MODE signal causes either the HFC[7:0] value or the LFC[7:0] value to be routed through multiplexer 1501. In the described example, the HF_MODE signal has a logic "0" value (low frequency mode), thereby causing the LFC[7:0] value to be passed. Multiplexers 1502, 1503 and 1504 are controlled to pass the LFC[7:0] value from the output of multiplexer 1501 to register M1. The LFC[7:0] value is loaded into register M1, thereby completing the IDLE state.

The primary state machine then enters an M1_TO_PROD state, in which the contents of register M1 are transferred into product register 1541. Note the product register 1541 was initially reset to store a logic zero value. Adder 1531 initially adds this initial zero value (on the B input terminal of adder 1531) to the contents of register M1 (on the A input terminal of adder 1531). The result (i.e., the LFC[7:0] constant) is loaded into product register 1541, thereby completing the M1_TO_PROD state.

The primary state machine then enters a TAP_TRIM_TO_M1 state, where the TAP_TRIM[8:0] signal is loaded into register M1. The primary state machine controls the multiplexers 1502–1504 to route the TAP_TRIM[8:0] signal to register M1.

The primary state machine then enters a SHIFT1 state, in which the TAP_TRIM[8:0] signal is multiplied by 2. This is accomplished by routing the TAP_TRIM[8:0] signal from the output of register M1 to the "1" input terminal of multiplexer 1506. This path shifts the TAP_TRIM[8:0] signal left by one bit, thereby effectively multiplying the TAP_TRIM[8:0] signal by 2. This corresponds with the multiply by 2 function described above in equation (7). The shifted TAP_TRIM[8:0] signal is routed through multiplexers 1506, 1503 and 1504 and is re-loaded into register M1.

If the HF_MODE signal has a logic "0" state (i.e., low frequency mode), then the primary state machine enters a SHIFT2 state, in which the TAP_TRIM[8:0] signal is again multiplied by 2 (thereby providing the multiply by four function required by equation (6)). The multiply by 2 operation of the SHIFT2 state is performed in the same manner as the multiply by 2 operation of the SHIFT1 state. If the HF_MODE signal has a logic "1" state (i.e., high frequency mode), then the primary state machine skips the SHIFT2 state.

The primary state machine then enters a ETT/P_TO_M1 state, in which the shifted TAP_TRIM[8:0] signal stored in register M1 is added to the LFC[7:0] constant stored in product register 1541, thereby creating the ETT/P value. To accomplish this, adder 1531 is controlled to add the contents of register M1 (i.e., the shifted TAP_TRIM[8:0] value) and the contents of product register 1541 (i.e., the LFC[7:0] constant). The result (i.e., the ETT/P value) is routed through multiplexer 1504 and loaded into register M1.

The primary state machine then enters a RST_PROD state, in which the contents of product register 1541 are reset to a zero value.

The primary state machine then enters a MULTIPLY state, in which the ETT/P value stored in register M1 is multiplied by the PS[7:0] value stored in register M0. The 19-bit adder 1531 is used to multiply these values, using an iterative add and shift method. Thus, adder 1531 initially adds zero to the ETT/P value, such that the ETT/P value is initially provided to the input terminal of product register 1541. At this time, the PS[0] bit is provided to the load terminal of product register 1541. If the PS[0] bit has a logic "1" value, then the ETT/P value is loaded into product register 1541. If the PS[0] bit has a logic "0" value, then the ETT/P value is not loaded into product register 1541 (i.e., product register 1541 continues to store a zero value). The contents of product register 1541 are provided to the B input terminal of adder 1531 as the P[18:0] signal.

After this first iteration, the PS[7:0] value is shifted to the right by one bit, such that register M0 provides the PS[1] bit to the load input terminal of product register 1541. Also after the first iteration, the ETT/P value stored in register M1 is shifted to the left by one bit by routing this value through the left-shifting input terminal of multiplexer 1506 and multiplexers 1503–1504. This left-shifted ETT/P value is loaded into register M1. Adder 1531 then provides an output equal to the sum of the left shifted ETT/P value and the contents of product register 1541. If the PS[1] bit has a logic "1" value, then the output of adder 1531 is loaded into product register 1541. If the PS[1] bit has a logic "0" value, then the output of adder 1531 is not loaded into product register 1541, and the contents of product register 1541 remain unchanged.

This process is repeated, with the ETT/P value stored in register M1 being shifted left and the PS[7:0] signal in register M0 being shifted right on each iteration. The process is completed when bits M0[7:1] all have logic "0" values. At this time, product register 1541 holds a value equal to ETT/P×PS_MAG (see equations (8), (9), (10)). If either one of bits P[18:17] provided by product register 1541 has a logic "1" value, then an overflow condition exists. Under these conditions, OR gate 1542 provides a logic high OVERFLOW signal, and product register 1541 is prevented from changing state until the MULTIPLY state is exited.

After the MULTIPLY state is complete, the primary state machine enters a PASS state. During the PASS state, bias adder/subtractor 1532 is allowed time to complete an add or subtract operation. Bits P[16:8] of product register 1541 are provided to the "A" input terminal of bias adder/subtractor 1532, thereby right shifting the contents of product register 1541 by 8 bits. This effectively divides the contents of product register by 256 (see equations (8), (9), (10)). The "B" input terminal of bias adder/subtractor 1532 is coupled to receive a value of either "0" (if CENTERED=0) or 256 (if CENTERED=1). Bias adder/subtractor 1532 will perform an addition (B+A) if AND gate 1543 provides a logic "0" output signal. Conversely, bias adder/subtractor 1532 will perform a subtraction (B−A) if AND gate 1543 provides a logic "1" output signal. AND gate 1543 only provides a logic "1" signal if delay lock loop 400 is configured in the variable mode (CENTERED=1), and up/down signed counter 1511 has a negative value (SIGN=1). If bit R[9] of bias adder/subtractor 1532 has a logic "1" value, OR gate 1542 will assert the OVERFLOW signal, thereby indicating that an overflow condition exists. As long as the OVERFLOW signal is not asserted, the result R[8:0] provided by bias adder/subtractor 1532 represents the desired PS_TT[8:0] signal.

Note that the OVERFLOW signal can be set due to any of the following: (a) the value provided by product register 1541 is not between 0 and 1FFFF, inclusive, (b) the R[8:0] output of bias adder/subtractor 1532 is not between 0 and 1FF, inclusive (c) tap/trim counter 1311 would wrap if changed in the selected direction, and (d) up/down counter 1511 would wrap if changed in the selected direction.

After the PASS state is complete, the primary state machine enters an ADJUST_PSTT state. In this state, the PS_TT[8:0] signal is set equal to the result R[8:0] provided by bias adder/subtractor 1532. The "A" input terminal of comparator 1533 is coupled to receive the result R[8:0] of bias adder/subtractor 1532. The "B" input terminal of comparator 1533 is coupled to receive the PS_TT[8:0] signal from up/down counter 1311. Comparator 1533 provides logic high signal to the clock enable input terminal (CE) of up/down counter 1311 if the R[8:0] signal is not equal to the PS_TT[8:0] signal, thereby enabling up/down counter 1311. Comparator 1533 also provides a logic high signal to the UP terminal of up/down counter 1311 if the PS_TT[8:0] signal is less than the R[8:0] signal. Conversely, logic block 1533 provides a logic low signal to the UP terminal of up/down counter 1311 if the PS_TT[8:0] signal is greater than or equal to the R[8:0] signal. Up/down counter 1311 is incremented by one if the UP terminal receives a logic "1"

signal, and is decremented by one if the UP terminal receives a logic "0" signal. Upon RESET, up/down counter 1311 is reset to a logic zero value. Consequently, up/down counter 1311 will adjust the PS_TT[8:0] value until this value is equal to the R[8:0] value (or until overflow occurs). When the PS_TT[8:0] signal is equal to the R[8:0] signal, or OVERFLOW is true, control logic 1550 sets the DONE signal. Control logic 1550 sets the PS_LOCKED signal the first time the DONE signal is asserted after RESET. The PS_LOCKED signal informs DLL control 1312 that the phase shift logic 1310 has been properly initialized. An exception is during the locking process, where the DONE signal is not set if OVERFLOW is true, so the PS_LOCKED signal will not set either.

The primary state machine then enters the WT_GONOT state, in which the state machine waits until the GO signal is inactive, and then enters the IDLE state.

External user interface 1320 is provided to allow dynamic changes to the phase shift (i.e., the fraction numerator of equations (8), (9), (10)) during normal operation. The user may increment or decrement the fraction numerator. In the variable modes, the fraction numerator may cross from positive through zero to negative, and vice-versa. External user interface 1320 is synchronous with the external clock signal PSCLK. Note that the rest of the clocked elements of phase shift control circuit 1310 are clocked by the PS_DLY_OUT clock signal. The module uses standard techniques to cross from the PSCLK domain to the PS_DLY_OUT clock domain and vice-versa.

A second state machine, namely, a dynamic phase change (DPS) state machine, controls user interface 1320. Running in the PS_DLY_OUT clock domain, the DPS state machine also ensures that changes are made to the signed up/down counter 1511 only when this counter is not being used by the primary state machine. After the DPS state machine is started, control proceeds to the next state after one clock cycle, unless otherwise noted in the description below.

The DPS state machine starts in a DPS_IDLE state, wherein the state machine waits for the PSEN signal to be asserted. Upon detecting the PSEN signal (as clocked in by the PSCLK signal), the DPS state machine will proceed to the next state. However, to avoid logical discontinuity, the DPS_IDLE state cannot be exited unless the primary state machine is in the IDLE state.

The DPS state machine then enters a DPS_CNTR state, in which counter 1511 is incremented if the captured PSIN-CDEC signal has a logic "1" value, and decremented if the captured PSINCDEC signal has a logic "0" value.

The DPS state machine then enters a DPS_W_ADJUST_PSTT state, in which the DPS state machine waits until the primary state machine completes a corresponding adjustment cycle. The DPS state machine remains in this state until the exit conditions for the primary state ADJUST_PSTT are true.

The DPS state machine then enters a DPS_SETDONE state, in which the PSDONE signal (which is coupled to the PSCLK domain) is set. The asserted PSDONE signal informs the user that the requested phase change has been completed. Processing then returns to the DPS_IDLE state.

In the foregoing manner, digital phase shifter 1100 is capable of precisely modifying the delay between the REF_CLK and S_CLK signals. This operation is controlled to compensate for low frequency and high frequency signals, as well as for variations in temperature. Advantageously, the phase can be modified both automatically and under user control.

Figure 16:
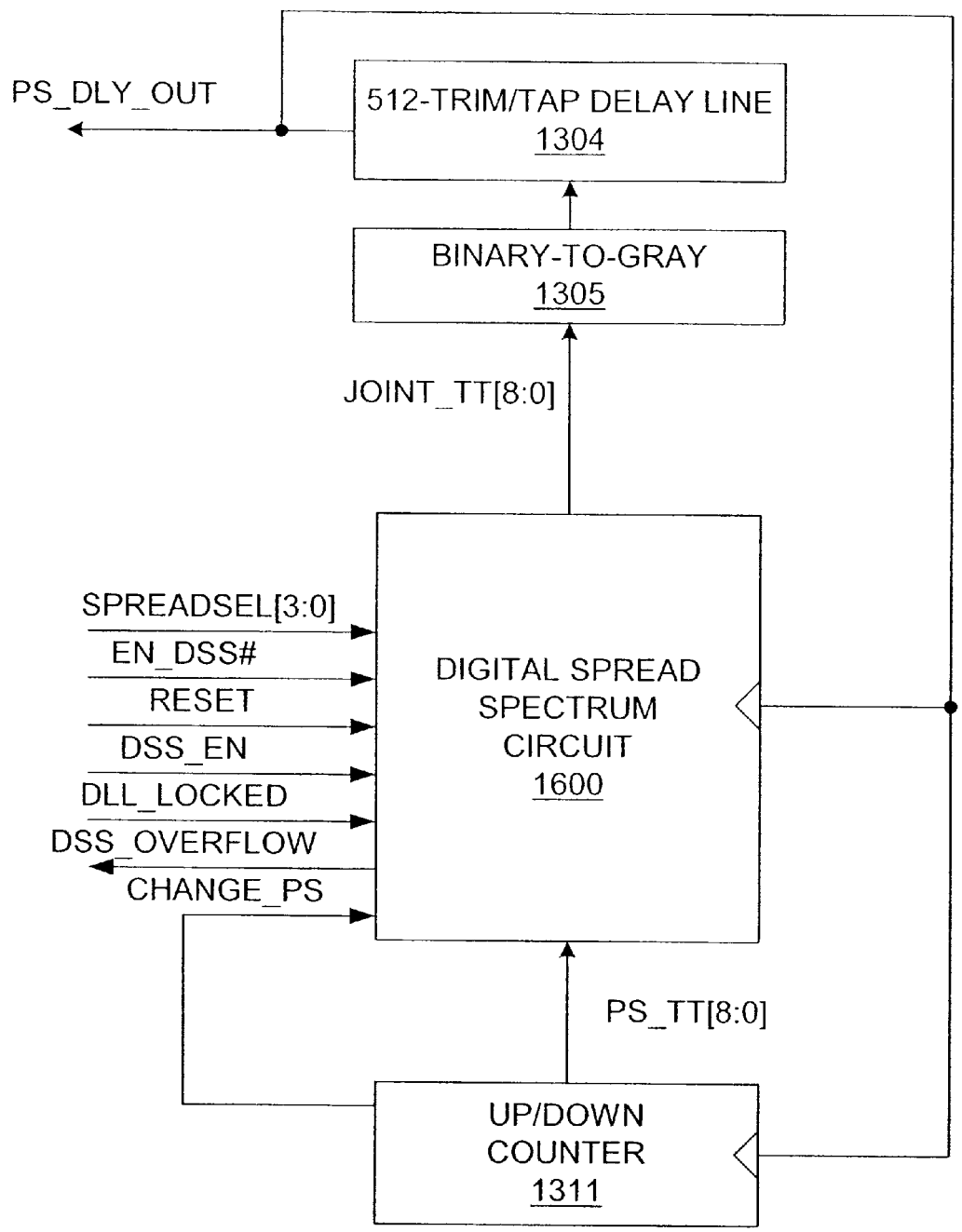
FIG. 16 is a block diagram of a digital spread spectrum (DSS) circuit in accordance with another embodiment of the present invention.

FIG. 16 is a block diagram of a digital spread spectrum (DSS) circuit 1600 in accordance with another embodiment of the present invention. DSS circuit 1600 is coupled between up/down counter 1311 and binary-to-gray conversion circuit 1305 (See, FIG. 13). Both up/down counter 1311 and DSS circuit 1600 are clocked by the PS_DLY_OUT signal. In general, DSS circuit 1600 can be configured to add or subtract small predetermined values to the PS_TT[8:0] signal to create the JOINT_TT[8:0] signal. In this case, DSS circuit 1600 is in a spread spectrum mode. While in the spread spectrum mode, the JOINT_TT[8:0] signal causes small variations in the clock period of the PS_DLY_OUT signal.

DSS circuit 1600 can also be configured to disable the spread spectrum mode, such that the PS_TT[8:0] signal is transmitted through DSS circuit 1600 without change. This is referred to as the DSS bypass mode.

Figure 17A:
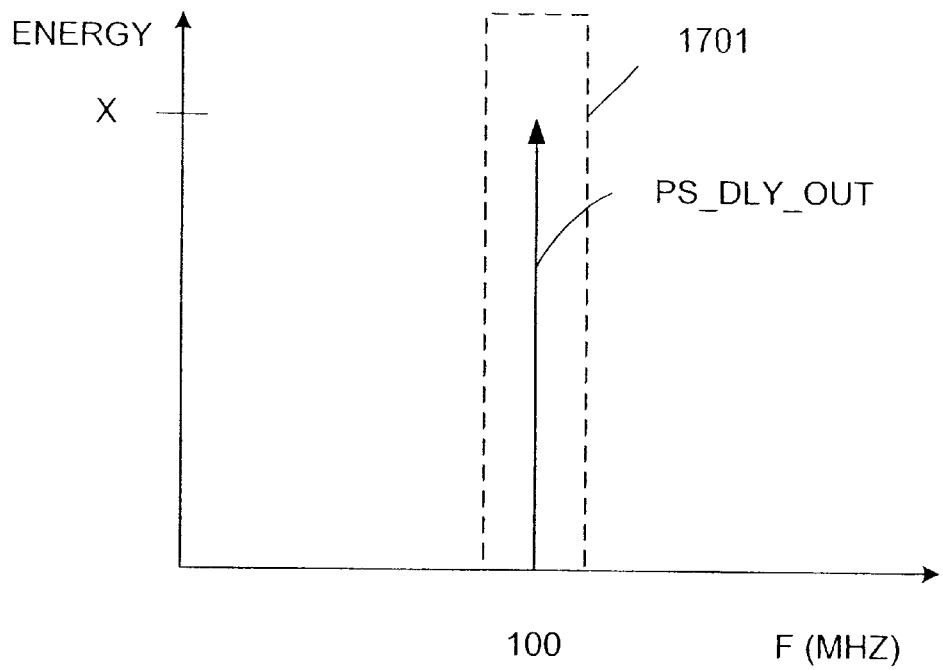
FIG. 17A is a graph illustrating a DSS bypass mode of the DSS circuit of FIG. 16.

FIG. 17A illustrates the DSS bypass mode, in which the PS_DLY_OUT signal has a frequency of 100 MHz and an energy of X. In determining the electromagnetic emission of the chip, the FCC will use a window 1701 having a specified width (e.g., 1 MHz). Because the PS_DLY_OUT signal has a single frequency, the 1 MHz window 1701 will capture all of the energy X of the PS_DLY_OUT signal.

Figure 17B:
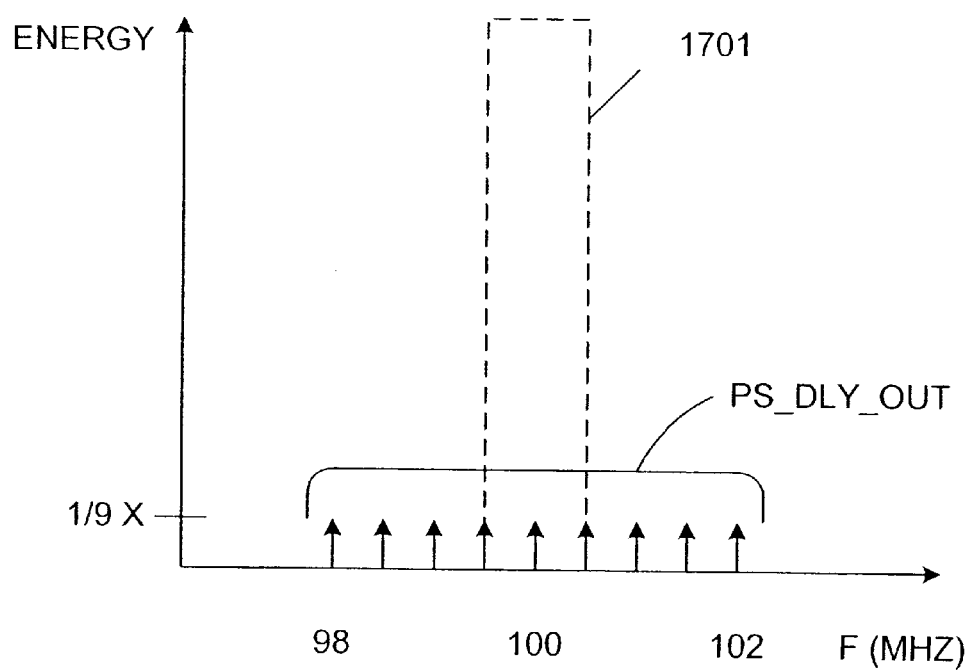
FIG. 17B is a graph illustrating a spread spectrum mode of the DSS circuit of FIG. 16.

FIG. 17B illustrates one of the spread spectrum modes of DSS circuit 1600, in which the PS_DLY_OUT signal is controlled to exhibit frequencies of approximately 98, 98.5, 99, 99.5, 100, 100.5, 101, 101.5 and 102 MHz. Because each of these frequencies exists only $1/9$ of the time, the PS_DLY_OUT signal has an energy of $1/9$ X at each of these frequencies. As a result, the 1 MHz window 1701 will only capture three of the nine frequencies at any given time. As a result, the energy detected by the 1 MHz window has a maximum value of $1/3$ X. This represents a significant reduction in EMI energy versus the bypass mode. As the base frequency of the PS_DLY_OUT signal changes, the number of frequencies existing within the 1 MHz window may change.

Figure 18:
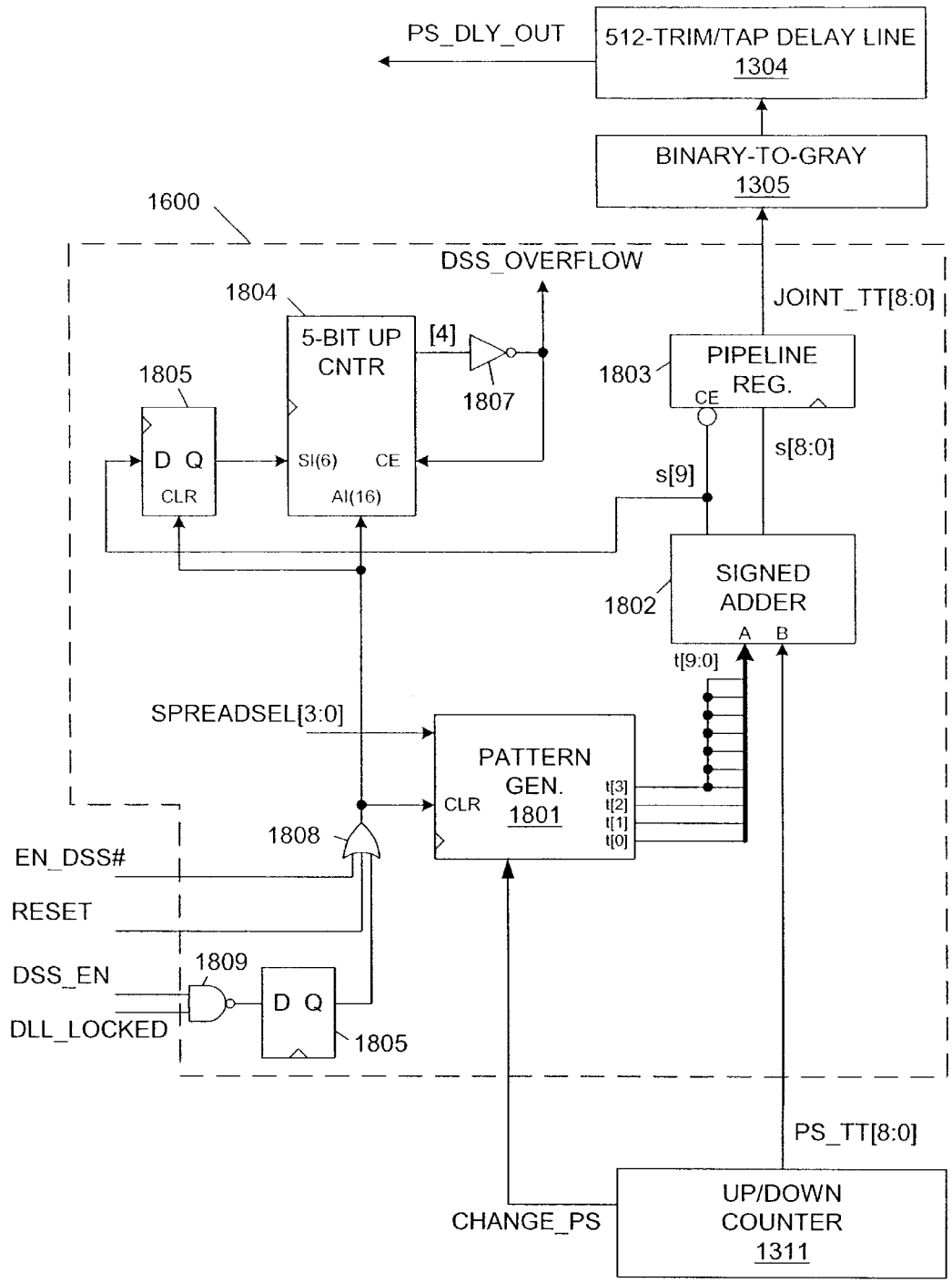
FIG. 18 is a circuit diagram of the DSS circuit of FIG. 16 in accordance with one embodiment of the present invention.

FIG. 18 is a circuit diagram of DSS circuit 1600 in accordance with one embodiment of the present invention. DSS circuit 1600 includes pattern generator 1801, signed adder 1802, pipeline register 1803, 5-bit up counter 1804, D flip-flops 1805–1806, inverter 1807, OR gate 1808, and NAND gate 1809. The elements of DSS circuit 1600 are clocked by the PS_DLY_OUT signal.

To enable DSS circuit 1600, a configuration memory bit is programmed to store a logic low EN_DSS# signal, thereby enabling the user to select whether or not the DSS circuit 1600 can be used during normal operation of delay lock loop 400. If the user wants to use DSS circuit 1600, the user must also provide a logic high DSS_EN signal to NAND gate 1809. The RESET signal is then asserted high, which causes OR gate 1808 to provide a logic high signal to clear pattern generator 1801, clear flip-flop 1805, and asynchronously set 5-bit up counter 1804 to a value of "10000" (i.e., binary 16).

Initially, delay lock loop 400 is not locked (i.e., DLL_LOCKED is low). As a result, NAND gate provides a logic "1" value, which is loaded into flip-flop 1805. This logic "1" value causes OR gate 1808 to provide a logic "1" output value, thereby maintaining pattern generator 1801 in a cleared state. At this time, pattern generator 1801 provides a trim signal t[9:0] having a value of zero. As a result, the PS_TT[8:0] signal provided by up/down counter 1311 passes through adder 1802 and pipeline register 1803 unchanged. This effectively removes DSS circuit 1600 from delay lock loop 400.

After delay lock loop 400 becomes locked, the DLLS_LOCKED signal transitions to a logic high value. In response, NAND gate 1809 provides a logic "0" output signal. This logic "0" signal is latched into flip-flop 1805 on the next rising edge of the PS_DLY_OUT signal. As a result, OR gate 1808 provides a logic "0" signal which releases pattern generator 1801, 5-bit up counter 1804 and flip-flop 1805. At this time, pattern generator 1801 is enabled to generate a predetermined pattern. The particular pattern is selected by the SPREADSEL[3:0] signal. In one embodiment, pattern generator 1801 is capable of generating patterns for creating spread-2, spread-4, spread-6, spread-8, spread-16, spread-32, and spread-64 configurations. In the present example, the SPREADSEL[3:0] signal is selected to provide a pattern for a spread-8 configuration.

In the described embodiment, up/down counter 1311 asserts a CHANGE_PS signal when the contents of up/down counter 1311 are being changed. When the CHANGE_PS signal is asserted, the output t[9:0] of pattern generator 1801 is prevented from changing, thereby avoiding contention between pattern generator 1801 and up/down counter 1311.

In general, pattern generator provides a trim value t[9:0] to the A input terminal of adder 1802, and counter 1311 provides the PS_TT[8:0] signal to the B input terminal of adder 1802. Note that a PS_TT[9] bit having a logic "0" value is concatenated to the PS_TT[8:0] signal. Also note that bits t[9:4] are set equal to t[3]. In the spread-8 pattern, the trim value t[9:0] can have values of 0, +1, +2, −1 and −2.

Adder 1802 performs a signed addition of the PS_TT[9:0] and t[9:0] signals, thereby providing a sum signal s[9:0]. As long as the sum bit s[9] has a logic "0" value, the sum value s[8:0] will be within the operating range of 512-tap delay line 1304. The logic "0" sum bit s[9] enables pipeline register 1803 to latch the s[8:0] signal. Pipeline register 1803 then transmits the s[8:0] to binary-to-gray decoder 1305 as the PS_TAP_TRIM[8:0] signal.

If sum bit s[9] has a value of "1", then pipeline register 1803 is disabled, and does not latch the corresponding s[8:0] signal. The logic "1" s[9] bit is clocked into flip-flop 1805 by the PS_DLY_OUT signal and provided to the synchronous input terminal SI(6) of 5-bit up counter 1804. When the PS_DLY_OUT signal is asserted high, 5-bit up counter 1804 is set to a value of "00110".

It should be noted that prior to loading counter 1804 with a value of "00110", counter 1804 was set to a value of "10000". Bit [4] of the counter (i.e., the "1" bit in "10000") is provided to inverter 1807. Inverter 1807, in turn, provides a logic "0" bit the enable input (CE) of 5-bit up counter 1804. As a result, the 5-bit up counter 1804 is effectively disabled until it is loaded with the "00110" value. The output of inverter 1807 is also used as a DSS_OVERFLOW signal.

After the "00110" value has been loaded into 5-bit up counter 1804, bit [4] of the counter has a logic "0" state. As a result, the DSS_OVERFLOW signal is asserted high, and 5-bit up counter 1804 is enabled. Once the DSS_OVERFLOW signal is set at a logic high state, this signal will remain in a logic high state for at least 10 cycles of the PS_DLY_OUT signal. The DSS_OVERFLOW signal will be reset to a logic low value if the s[9] signal transitions back to a logic "0" value, and remains at a logic "0" value for 10 consecutive cycles of the PS_DLY_OUT signal. After the s[9] signal transitions to a logic "0" value, counter 1804 will begin counting up. If the s[9] signal remains at a logic "0" state for ten clock cycles, then counter 1804 will count up to "10000", thereby clearing the DSS_OVERFLOW signal. However, if the s[9] signal has a logic "1" value any time during these ten clock cycles, then the 5-bit counter will be reset to a "00110" value, thereby resulting in a logic high DSS_OVERFLOW signal. This enables the user to reliably sample the status of the DSS_OVERFLOW signal. (In the described embodiment, the DSS_OVERFLOW signal is logically OR'ed with the OVERFLOW signal of FIG. 15, thereby providing a single signal to identify overflow conditions.)

The trim signals t[9:0] generated by pattern generator 1801 determine how the period of the PS_DLY_OUT signal is adjusted. A spread-8 configuration will now be described. This example assumes that the REF_CLK signal has a base frequency of 100 MHz, and that the 512-tap/trim delay line 1304 is connected in line with the REF_CLK signal (i.e., S_LAGS_REF=1 and CENTERED=1). This example also assumes that one trim delay is equal to 50 picoseconds (ps).

Figure 19A:
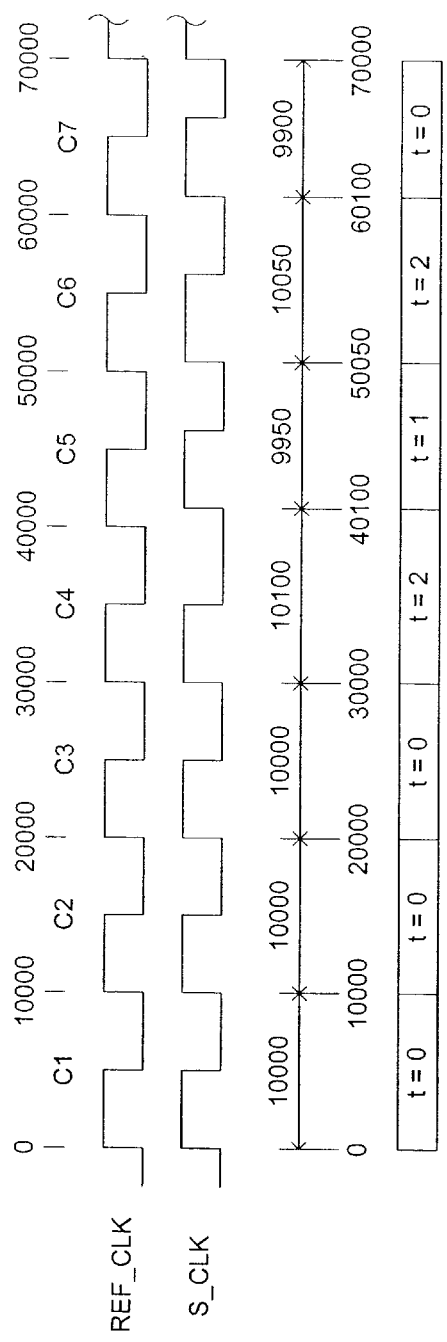
FIGS. 19A–19B are waveform diagrams illustrating reference clock and skew clock signal that result when the DSS circuit of FIG. 16 is controlled to implement a spread-8 configuration.
Figure 19B:
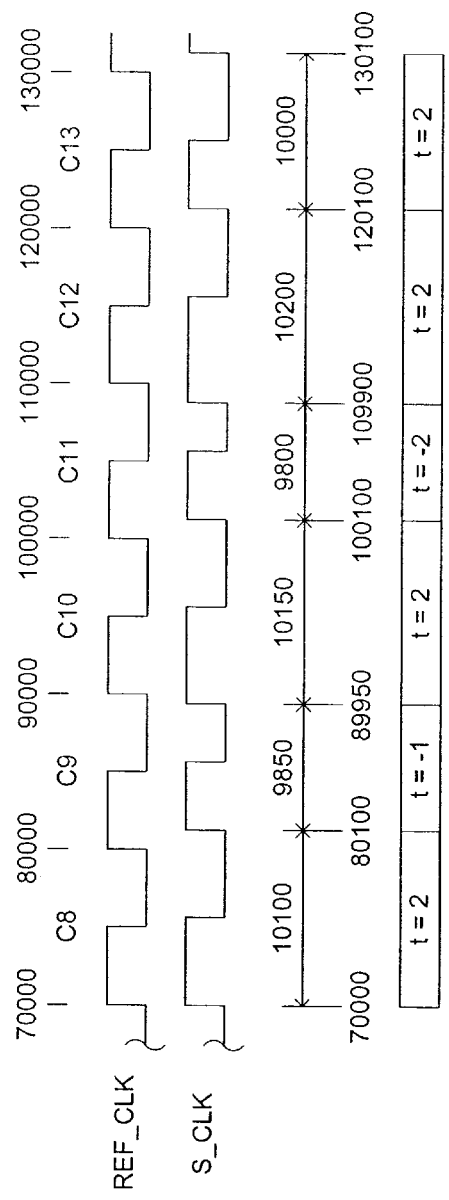

FIGS. 19A–19B are waveform diagrams illustrating the REF_CLK and S_CLK signals when DSS circuit 1600 is controlled to implement a spread-8 configuration. During the first three clock cycles C1–C3 (i.e., until 30000 ns) DSS circuit 1600 is disabled by the DSS_EN signal provided by the user. As a result, pattern generator 1801 provides a trim signal t[9:0] having a value of 0. During these three clock cycles C1–C3, the REF_CLK and S_CLK are synchronized, with each of these signals having a period of 10000 ns.

During the fourth clock cycle C4, pattern generator 1801 is enabled and provides a trim signal t[9:0] having a value equal to 2 trim settings. In response, signed adder circuit 1802 provides adds two trim settings to the PS_TT[8:0] signal provided by up/down counter 1311. As a result, the cycle C4 of the S_CLK signal is lengthened by two trim settings, or 100 ps. Cycle C4 of the S_CLK signal therefore has a period of 10100 ns, such that the rising edge of the fifth cycle C5 of the S_CLK signal occurs at 40100 ns. At this time, there is an initial offset of 100 ns between the REF_CLK and S_CLK signals. This initial offset is provided one time only before implementing the normal spread-8 configuration. This initial offset enables the spread 8 configuration to be implemented in an optimal manner as described below.

During the fifth clock cycle C5, pattern generator 1801 provides a trim signal t[9:0] having a value equal to 1 trim setting. This represents a change of −1 trim setting (−50 ps) with respect to the previous cycle. As a result, the S_CLK signal will have a period equal to 10000 ps −50 ps, or 9950 ps, such that the rising edge of the next clock cycle C6 occurs at 50050 ns. The frequency of the S_CLK signal is equal to 100.5 MHz during cycle C5.

During the sixth clock cycle C6, pattern generator 1801 provides a trim signal t[9:0] having a value equal to 2 trim settings. This represents a change of +1 trim setting (+50 ps) with respect to the previous cycle. As a result, the S_CLK signal will have a period equal to 10000 ps+50 ps, or 10050 ps, such that the rising edge of the next clock cycle C7 occurs at 60100 ns. The frequency of the S_CLK signal is equal to 99.5 MHz during cycle C5.

Processing continues, with pattern generator 1801 providing trim signals t[9:0] having values of 0, 2, −1, 2, −2, 2, and 2 during clock cycles C7–C13, respectively. These trim values correspond with trim differences of −2, 2, −3, 3, −4, 4 and 0 during clock cycles C7–C13, respectively. As a result, the S_CLK signal has periods of 9900, 10100, 9850, 10150, 9800, 10200 and 10000 ps during clock cycles C7–C13, respectively. This means that the S_CLK signal has frequencies of 101, 99, 101.5, 98.5, 102, 98 and 100 MHz, during clock cycles C7–C13, respectively. This provides for each of the eight frequencies illustrated in FIG. 17B, plus the base frequency of 100 MHz. The pattern of clock cycles C5–C13 is repeated during the operation of delay lock loop 400, thereby continuing the spread spectrum operation.

In the example of FIGS. 19A and 19B, the skew between the REF_CLK signal and the S_CLK signal is equal to 50, 100, 0, 100, −50, 100, −100, 100 and 100 ps during clock cycles C5–C13, respectively. Thus, the skew between these two signals has a maximum value of 100 ps, and an average value of 44.4 ps. This is a relatively stable clock signal in view of the large number of frequencies provided.

In another embodiment of the present invention, the initial offset provided during clock cycle C4 can be eliminated. In this embodiment, the trim values provided by pattern generator 1801 are selected to be −1, 0, −2, 0, −3, 0, −4, 0 and 0 during clock cycles C5–C13, respectively. These trim values correspond with trim differences of −1, 1, −2, 2, −3, 3, −4, 4 and 0 during clock cycles C5–C13, respectively. As a result, the S_CLK signal has periods of 9950, 10050, 9900, 10100, 9850, 10150, 9800, 10200 and 10000 ps during clock cycles C5–C13, respectively. This means that the S_CLK signal has frequencies of 100.5, 99.5, 101, 99, 101.5, 98.5, 102, 98 and 100 MHz, during clock cycles C5–C13, respectively. Again, this provides for each of the eight frequencies illustrated in FIG. 17B, plus the base frequency of 100 MHz. The pattern of clock cycles C5–C13 is repeated during the operation of delay lock loop 400, thereby continuing the spread spectrum operation. In this example, the skew between the REF_CLK signal and the S_CLK signal is equal to −50, 0, −100, 0, −150, 0, −200, 0, and 0 ps, respectively during clock cycles C5–C13, respectively. Thus, the skew between these two signals has a maximum value of 200 ps, and an average value of −55.6 ps.

Although a spread-8 configuration (i.e., a base frequency plus eight spread frequencies) has been described, it is understood that other spread spectrum configurations can also be implemented, and are considered to fall within the scope of the present invention. For example, spread-2, spread-4 and spread-6 configurations can be provided. Pattern generator 1801 provides a pattern of trim values equal to −1, 0 and 0 to provide the three frequencies of the spread-2 configuration.

Pattern generator 1801 provides a pattern of trim values equal to −1, 0, −2, 0 and 0 to provide the five frequencies of the spread-4 configuration. To add an initial offset, pattern generator 1801 can provide a pattern of trim values equal to 1 (initial offset), 0, 1, −1, 1, and 1 to provide the five frequencies of the spread-4 configuration.

Pattern generator 1801 provides a pattern of trim values equal to −1, 0, −2, 0, −3, 0 and 0 to provide the seven frequencies of the spread-6 configuration. To add an initial offset, pattern generator 1801 can provide a pattern of trim values equal to 1 (initial offset), 0, 1, −1, 1, −2, 1 and 1 to provide the seven frequencies of the spread-6 configuration.

Table 1 below summarizes characteristics of spread-2, spread-4, spread-6 and spread-8 configurations for a 100 MHz base clock signal.

TABLE 1

| DSS MODE | NONE | SPREAD-2 | SPREAD-4 | SPREAD-6 | SPREAD-8 |
|---|---|---|---|---|---|
| # of new freq. | 0 | 2 | 4 | 6 | 8 |
| Total # of freq. | 1 | 3 | 5 | 7 | 9 |
| % EMI peak reduction | 0 | 67 | 80 | 86 | 89 |
| +/− spread (trim units) | 0 | 1 | 2 | 3 | 4 |
| +/− spread (ps) | 0 | 50 | 100 | 150 | 200 |

Table 2 below summarizes the +/− spread of the base clock signal for the various DSS modes for selected frequencies between 25 MHz and 400 MHz.

TABLE 2

| | | +/− Spread (% of period) | | | | |
|---|---|---|---|---|---|---|
| Freq. | Period | NONE | SPRD-2 | SPRD-4 | SPRD-6 | SPRD-8 |
| 25 MHz | 40 ns | 0.00% | 0.13% | 0.25% | 0.38% | 0.50% |
| 50 | 20 | 0.00% | 0.25% | 0.50% | 0.75% | 1.00% |
| 100 | 10 | 0.00% | 0.50% | 1.00% | 1.50% | 2.00% |
| 200 | 5 | 0.00% | 1.00% | 2.00% | 3.00% | 4.00% |
| 400 | 2.5 | 0.00% | 2.00% | 4.00% | 6.00% | 8.00% |

Table 3 below summarizes the number of ideal peaks within a 1 MHz window for the various DSS modes for selected frequencies between 25 MHz and 400 MHz.

TABLE 3

| | | # IDEAL PEAKS INSIDE 1 MHZ WINDOW | | | | |
|---|---|---|---|---|---|---|
| Freq. | Period | NONE | SPRD-2 | SPRD-4 | SPRD-6 | SPRD-8 |
| 25 MHz | 40 ns | 1 | 3 | 5 | 7 | 9 |
| 50 | 20 | 1 | 3 | 5 | 7 | 9 |
| 100 | 10 | 1 | 3 | 3 | 3 | 3 |
| 200 | 5 | 1 | 1 | 1 | 1 | 1 |
| 400 | 2.5 | 1 | 1 | 1 | 1 | 1 |

Table 4 below summarizes the percentage of EMI energy reduction within a 1 MHz window for the various DSS modes for selected frequencies between 25 MHz and 400 MHz.

TABLE 4

| | | +/− Spread (% of period) | | | | |
|---|---|---|---|---|---|---|
| Freq. | Period | NONE | SPRD-2 | SPRD-4 | SPRD-6 | SPRD-8 |
| 25 MHz | 40 ns | 0% | 0% | 0% | 0% | 0% |
| 50 | 20 | 0% | 0% | 0% | 0% | 0% |
| 100 | 10 | 0% | 0% | 40% | 57% | 67% |
| 200 | 5 | 0% | 67% | 80% | 86% | 89% |
| 400 | 2.5 | 0% | 67% | 80% | 86% | 89% |

Table 5 below summarizes the EMI energy reduction within a 1 MHz window in db for the various DSS modes for selected frequencies between 25 MHz and 400 MHz.

TABLE 5

| | | 1 MHZ EMI ENERGY REDUCTION (db) | | | | |
|---|---|---|---|---|---|---|
| Freq. | Period | NONE | SPRD-2 | SPRD-4 | SPRD-6 | SPRD-8 |
| 25 MHz | 40 ns | 0 | 0 | 0 | 0 | 0 |
| 50 | 20 | 0 | 0 | 0 | 0 | 0 |
| 100 | 10 | 0 | 0 | −2.2 | −3.7 | −4.8 |
| 200 | 5 | 0 | −4.8 | −7.0 | −8.5 | −9.5 |
| 400 | 2.5 | 0 | −4.8 | −7.0 | −8.5 | −9.5 |

Table 6 below summarizes the 1 MHz window range for selected frequencies between 25 MHz and 400 MHz.

TABLE 6

| Frequency (MHz) | Period (ns) | 1 MHz Window Range (period) |
|---|---|---|
| 25 | 40 | 39.22 to 40.82 ns |
| 50 | 20 | 19.80 to 20.20 ns |
| 100 | 10 | 9.95 to 10.05 ns |
| 200 | 5 | 4.99 to 5.01 ns |
| 400 | 2.5 | 2.497 to 2.503 ns |

Although the invention has been described in connection with several embodiments, it is understood that this invention is not limited to the embodiments disclosed, but is capable of various modifications which would be apparent to a person skilled in the art. For example, in view of this disclosure those skilled in the art can define other clock phase shifters, delay lines, output generators, controllers, phase detectors, and so forth, and use these alternative features to create a method, circuit, or system according to the principles of this invention. Thus, the invention is limited only by the following claims.

X-444-2P-1 US  
October 6, 2000

PATENT

APPENDIX A

| APPENDIX A TERMINOLOGY | CORRESPONDING TERMINOLOGY USED IN THE SPECIFICATION |
|---|---|
| DLL | Delay Lock Loop 400 |
| ZD2 section | Clock Phase Shifter 350 |
| PS section | Digital Phase Shifter 1100 |
| ZD1 section | Delay Line 310 |

| | |
|---|---|
| ResetZD2 | Reset Clock Phase Shifter 350 |
| ResetPS | Reset Digital Phase Shifter 1100 |
| ResetZD1 | Reset Delay Line 310 |
| ChangeZD2 | When asserted, allows Clock Phase Shifter 350 to make a tap/trim change |
| GoPS | GO (when asserted, allows Digital Phase Shifter to make a tap/trim change) |
| ChangeZD1 | When asserted, allows Delay Line 310 to make a tap/trim change |
| DLL_locked | DLL_LOCKED |
| locked_pre | Similar to DLL_LOCKED, except it remains true even if overflow occurs |
| PSlocked | When asserted, indicates that the initial tap/trim for delay line 1304 has been set |
| FREEZEDLL | User signal that holds all updates to delay lines in Delay Lock Loop 400 |
| EnZD2 | Configuration bit that enables Clock Phase Shifter 350 (allows ResetZD2 to go inactive) |
| EnPS | Configuration bit that enables Digital Phase Shifter 1100 (allows ResetPS to go inactive) |
| EnZD1 | Configuration bit that enables Delay Line 310 (allows Reset ResetZD1 to go inactive) |

| | |
|---|---|
| CTLMODE | When true, DLL 400 is in test mode |
| Z2locked | When asserted, indicates that Clock Phase Shifter 350 delay lines have been adjusted (i.e., total delay is one CLKIN period) |
| DonePS | DONE |
| Z1locked | When asserted, indicates that Delay line 310 has been adjusted (i.e., PS_S_CLK and PS_REF_CLK are in phase) |
| ZD2overflow | When asserted, indicates a wrap attempt on one or more delay line sections in Clock Phase Shifter 350 |
| ZD1overflow | When asserted, indicates a wrap attempt on Delay Line 310 |
| Clk | REF_CLK |

X-444-2P-1 US  
October 6, 2000

PATENT

```
/******************************************************************
*
*    File Name:   DLLmngr_9.v
*     Version:    snapshot_00.08.07revA
*    Generated:   Tue Sep 26 17:15:26 2000 (Pacific Time)
*
*      Author:    John Logue
*       Email:    john.logue@xilinx.com
*     Company:    Xilinx
*
*                 Copyright (c) 2000 Xilinx, Inc.
*                 All rights reserved
*
******************************************************************/

`timescale 1 ps / 1 ps module DLLmngr_9(
            ResetZD2, ResetPS, ResetZD1,
            ChangeZD2, GoPS, ChangeZD1,
            DLL_locked, locked_pre,
            PSlocked, FREEZEDLL, EnZD2, EnPS, EnZD1, CTLMODE,
            DeadTime, LiveTime, z2Locked, DonePS, z1Locked,
            ZD2overFlow,
            // PSoverFlow,
            ZD1overFlow,
            Clk, Reset);

// This is a one-hot state machine that controls modules zd2Synth, PhaseShift,
// and zd1Synth.
// It has the following configuration:
//    Timeout counter width in bits: 9

// FREEZEDLL operation:

// If FREEZEDLL_S goes true when in a state between updates (deadtime), that
// state is retained until FREEZEDLL_S goes false; i.e., it hangs in that state
// until FREEZEDLL_S goes false.

// If FREEZEDLL_S goes true when updating PS, nothing happens until it advances
// to the next deadtime state, where it hangs until FREEZEDLL_S goes false.

// If FREEZEDLL_S goes true when updating ZD1 or ZD2, it immediately exits to
// the corresponding deadtime state, where it hangs until FREEZEDLL_S goes
// false.

output ResetZD2;        // ZD2 reset
output ResetPS;         // PhaseShift reset
output ResetZD1;        // ZD1 reset
output ChangeZD2;       // Allow ZD2 to make a tap/trim change
output GoPS;            // Go signal to PhaseShift
output ChangeZD1;       // Allow ZD1 to make a tap/trim change
output DLL_locked;      // DLL top level locked status
output locked_pre;      // locked status that remains true if overflow occurs
```

X-444-2P-1 US  
October 6, 2000

PATENT

```
input    PSlocked;       // The initial Phase Shift tap/trim has been set
input    FREEZEDLL;      // Halts all DLL delay line updates as soon as possible
input    EnZD2;          // config bit:  ZD2 enabled
input    EnPS;           // config bit:  PhaseShift enabled
input    EnZD1;          // config bit:  ZD1 enabled
input    CTLMODE;        // true when test mode selected
input [7:0] DeadTime;    // init value for Timeout cntr between module enables
input [7:0] LiveTime;    // init value for Timeout cntr during ZD2 & ZD1 enables
input    z2Locked;       // ZD2 is locked
input    DonePS;         // Done signal from PhaseShift
input    z1Locked;       // ZD1 locked
input    ZD2overFlow;    // Wrap attempt on one or more ZD2 delay lines
input    ZD1overFlow;    // Wrap attempt on ZD1 delay line input    Clk;
input    Reset;          // asynchronous reset // ************  DLL Locked  **************

// DLL_locked goes true when all selected functions are locked.
// Overflow on ZD1 or ZD2 causes it to go false (if the function is selected).
// It is always true if no functions are selected.
assign DLL_locked = (~EnZD2 | (z2Locked & ~ZD2overFlow))
                  & (~EnPS  | (PSlocked))
                  & (~EnZD1 | (z1Locked & ~ZD1overFlow));

// locked_pre is an SR latch that remembers the 1st DLL_locked after Reset
assign locked_pre = ~(Reset | ~(DLL_locked | locked_pre));

// ************  Synchronizers  ************** reg z2Locked_S;
always @(posedge Clk) z2Locked_S    <= #`FFDLY z2Locked;

reg DonePS_S;
always @(posedge Clk) DonePS_S      <= #`FFDLY DonePS;

reg z1Locked_S;
always @(posedge Clk) z1Locked_S    <= #`FFDLY z1Locked;

reg FREEZEDLL_S;
always @(posedge Clk) FREEZEDLL_S   <= #`FFDLY FREEZEDLL;

// **************  State Machine Parameters  ****************

// define state bit numbers
parameter IDLE    = 0,   // 001 Must be bit 0 (State is Reset to 1)
          INITPS  = 1,   // 002 initialize PhaseShift
          INITZD1 = 2,   // 004 initialize ZD1
          WDZD2   = 3,   // 008 wait dead time before changing ZD2
          WLZD2   = 4,   // 010 wait live time while changing ZD2
          WDPS    = 5,   // 020 wait dead time before changing PhaseShift
          WDONE   = 6,   // 040 wait PhaseShift Done
          WDZD1   = 7,   // 080 wait dead time before changing ZD1
          WLZD1   = 8;   // 100 wait live time while changing ZD1 reg [WLZD1:0] State;     // Current state
```

X-444-2P-1 US  
October 6, 2000

PATENT

```
reg [WLZD1:0] NextState;   // next state assign ChangeZD2 = State[IDLE]    | State[WLZD2];
assign ChangeZD1 = State[INITZD1] | State[WLZD1];
assign GoPS      = State[INITPS]  | State[WDONE];

// ************** Resets ****************

// This section generates reset signals for ZD2, PS, ZD1, and the DLLmngr
// itself. All resets go active while Reset is true. The various resets
// then go inactive (or not) as follows:

// ResetZD2 - goes inactive immediately if EnZD2 is true; otherwise,
//            it never goes inactive.

// ResetPS  - goes inactive immediately if EnPS & CTLMODE are both true, else
//            goes inactive when ZD2 locks, if EnPS is true; otherwise,
//            it never goes inactive.

// ResetZD1 - goes inactive immediately if EnZD1 & CTLMODE are both true;
//            otherwise, it goes inactive synchronous to the rising edge of
//            Clk when signal RelResetZD1 is true.

// DLLmngrReset - goes inactive immediately if any of ZD2, PS, or ZD1 are
//                enabled AND Test Mode is not selected. Otherwise, it
//                never goes inactive.

wire ResetZD2n = ~(Reset | (~(ResetZD2n | EnZD2))); // SR latch
wire ResetZD2  = ~ResetZD2n;

wire ClrResetPS = EnPS & (z2Locked | CTLMODE);   // JDL 07/31/00 wire ResetPSn = ~(Reset | (~(ResetPSn | ClrResetPS))); // SR latch   JDL
07/24/00
wire ResetPS  = ~ResetPSn;

wire RelResetZD1 = State[INITPS] & EnZD1 & (~EnPS | DonePS_S);

wire AsyncClr = EnZD1 & CTLMODE;
reg ResetZD1;
always @(posedge Clk or posedge Reset or posedge AsyncClr)
begin
   if (Reset)          ResetZD1 <= #`FFDLY 1'b1;    // async set
   else if (AsyncClr)  ResetZD1 <= #`FFDLY 1'b0;    // async clr
   else if(RelResetZD1) ResetZD1 <= #`FFDLY 1'b0;   // edge trigger
end wire EnDLLmngr = (EnZD2 | EnPS | EnZD1) & ~CTLMODE;

wire DLLmngrResetN = ~(Reset | (~(DLLmngrResetN | EnDLLmngr))); // SR latch
wire DLLmngrReset  = ~DLLmngrResetN;

// ************ TimeOut Counter ************** wire SelLive = State[WDZD2] | State[WDPS] | State[WDZD1];

wire [7:0] TOcntrMux = SelLive ? LiveTime : DeadTime;
```

57

X-444-2P-1 US　　　　　　　　　　　　　　　　　　　　　　　　　　　　　　　　　PATENT
October 6, 2000

```
wire [8:0] TOcntr;
wire TO = TOcntr[8]; // timeout wire LdTOcntr = State[INITZD1]
              | (State[WDZD2] & TO)
              | (State[WLZD2] & TO)
              | (State[WDPS]  & TO)
              |  State[WDONE]
              | (State[WDZD1] & TO)
              | (State[WLZD1] & TO);

// instantiate timeout counter
cntr_9_AI_0_LD_CE_DN TOC(
          .Out(TOcntr),
          .AI(DLLmngrReset),
          .LD(LdTOcntr),
          .In({1'b0, TOcntrMux}),
          .CE(~TO),
          .Clk(Clk));

// ************ State Machine ************ always @(posedge Clk or posedge DLLmngrReset)
  if(DLLmngrReset) State <= #`FFDLY 1;  // select IDLE state on Reset
       else State <= #`FFDLY NextState;

// next state network
always @(State or EnZD1 or EnZD2 or EnPS or
         z2Locked_S or DonePS_S or z1Locked_S or TO or FREEZEDLL_S)
begin
  NextState = 0;

case(1'b1) // synopsys parallel_case full_case
    State[IDLE]    : begin // idle
                       if(EnZD2 & ~z2Locked_S) NextState[IDLE]  = 1'b1;
                                         else NextState[INITPS] = 1'b1;
                     end
    State[INITPS]  : begin // initialize PhaseShift
                       if(EnPS & ~DonePS_S) NextState[INITPS] = 1'b1;
                                       else NextState[INITZD1] = 1'b1;
                     end
    State[INITZD1] : begin // initialize ZD1
                       if(EnZD1 & ~z1Locked_S)
                       begin
                         NextState[INITZD1] = 1'b1;
                       end
                       else
                       begin
                         if (EnZD2) NextState[WDZD2] = 1'b1;
                               else NextState[WDZD1] = 1'b1;
                       end
                     end
    State[WDZD2]   : begin // wait dead time before changing ZD2
                       if(~TO | FREEZEDLL_S) NextState[WDZD2] = 1'b1;
                                        else NextState[WLZD2] = 1'b1;
                     end
```

58

X-444-2P-1 US  
October 6, 2000

PATENT

```
        State[WLZD2]    : begin // wait live time while changing ZD2
                             if(~TO & ~FREEZEDLL_S)      NextState[WLZD2] = 1'b1;
                                 else if (FREEZEDLL_S)   NextState[WDZD2] = 1'b1;
                                 else if (EnPS)          NextState[WDPS]  = 1'b1;
                                 else if (EnZD1)         NextState[WDZD1] = 1'b1;
                                 else                    NextState[WDZD2] = 1'b1;
                          end
        State[WDPS]     : begin // wait dead time before changing PhaseShift
                             if(~TO | FREEZEDLL_S) NextState[WDPS] = 1'b1;
                                              else NextState[WDONE] = 1'b1;
                          end
        State[WDONE]    : begin // wait PhaseShift Done
                             if(~DonePS_S) NextState[WDONE] = 1'b1;
                                 else if (EnZD1) NextState[WDZD1] = 1'b1;
                                            else NextState[WDZD2] = 1'b1;
                          end
        State[WDZD1]    : begin // wait dead time before changing ZD1
                             if(~TO | FREEZEDLL_S) NextState[WDZD1] = 1'b1;
                                              else NextState[WLZD1] = 1'b1;
                          end
        State[WLZD1]    : begin // wait live time while changing ZD1
                             if(~TO & ~FREEZEDLL_S)      NextState[WLZD1] = 1'b1;
                                 else if (FREEZEDLL_S)   NextState[WDZD1] = 1'b1;
                                 else if(EnZD2)          NextState[WDZD2] = 1'b1;
                                 else                    NextState[WDZD1] = 1'b1;
                          end
        default         : begin
                             NextState = 9'bx;
                          end
    endcase
end endmodule
```

X-444-2P-1 US
October 6, 2000

PATENT

DLL Manager

Overview

This is the master control module for the DLL. It performs the following functions:

1. Sequences the Reset signals to the ZD2, PS, and ZD1 sections.

2. Ensures that the sections initialize (lock) in the proper sequence (ZD2, PS, ZD1).

3. Ensures that clock cycles that are shortened or lengthened due to a trim change are not sampled by the phase detector of another DLL section. This is done by allowing only one section to change trims at a given time, and inserting a no activity time between each allowed change.

4. Generates DLL_locked signal.

FREEZEDLL Notes

If FREEZEDLL_S goes true when in a state between updates (deadtime), that state is retained until FREEZEDLL_S goes false; i.e., it hangs in that state until FREEZEDLL_S goes false.

If FREEZEDLL_S goes true when updating PS, nothing happens until it advances to the next deadtime state, where it hangs until FREEZEDLL_S goes false.

If FREEZEDLL_S goes true when updating ZD1 or ZD2, it immediately exits to the corresponding deadtime state, where it hangs until FREEZEDLL_S goes// false.

Input & Output Pins

```
Outputs
ResetZD2      ZD2 reset
ResetPS       Phaseshift reset
ResetZD1      ZD1 reset
ChangeZD2     Allow ZD2 to make a tap/trim change
GoPS          Go signal to Phaseshift
ChangeZD1     Allow ZD1 to make a tap/trim change
DLL_locked    DLL top level locked status
locked_pre    locked status that remains true if overflow occurs Inputs
PSlocked      The initial Phase shift tap/trim has been set
FREEZEDLL     Halts all DLL delay line updates as soon as possible
EnZD2         config bit:  ZD2 enabled
EnPS          config bit:  Phaseshift enabled
EnZD1         config bit:  ZD1 enabled
CTLMODE       true when test mode selected
DeadTime [7:0]  init value for Timeout cntr between module enables
LiveTime [7:0]  init value for Timeout cntr during ZD2 & ZD1 enables
z2Locked      ZD2 is locked
DonePS        Done signal from Phaseshift
z1locked      ZD1 locked
ZD2overFlow   Wrap attempt on one or more ZD2 delay lines
ZD1overFlow   Wrap attempt on ZD1 delay line
Reset         Asynchronous DCM Reset (RST)
Clk           Connected to DCM input clock (CLKIN)
```

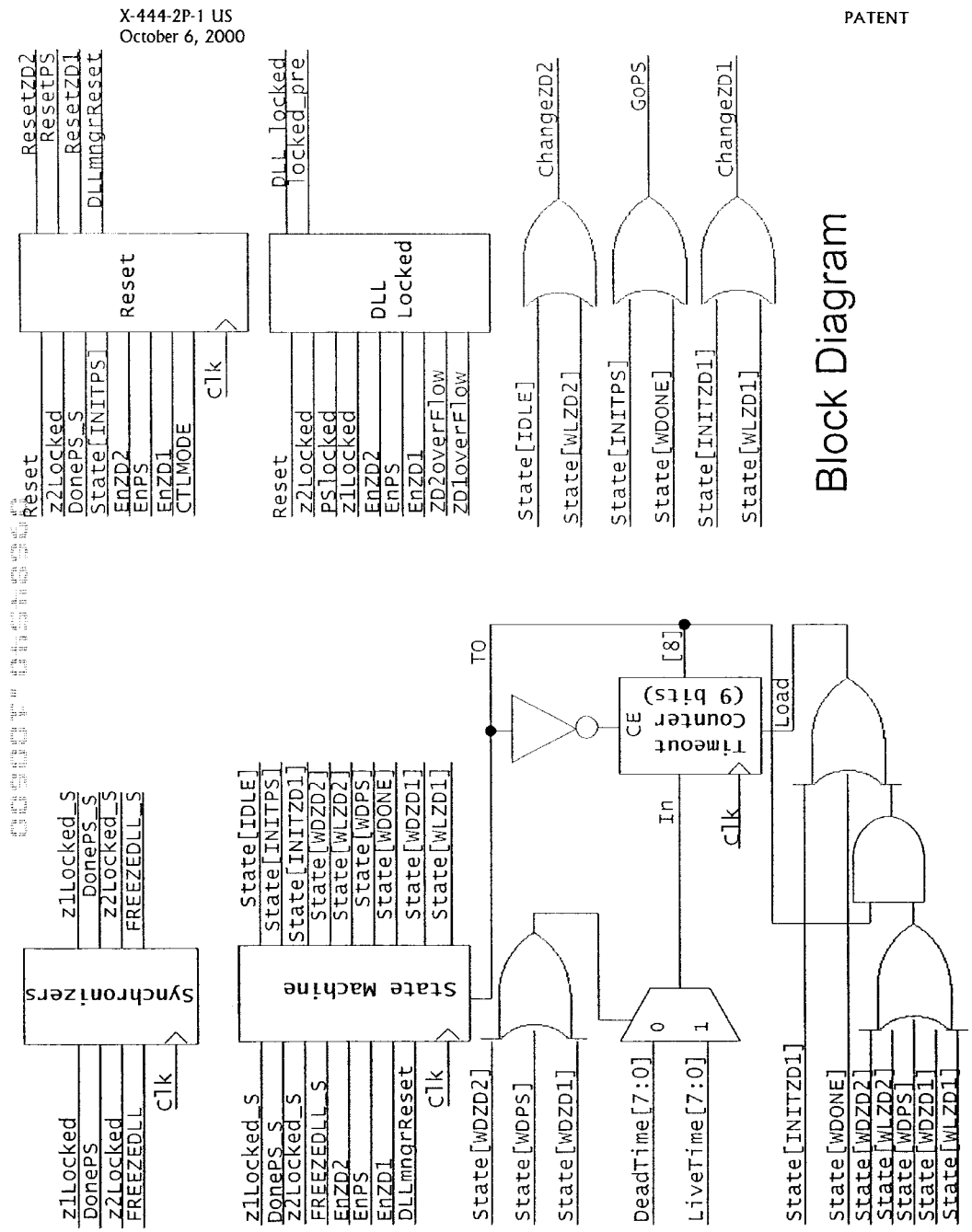
Block Diagram

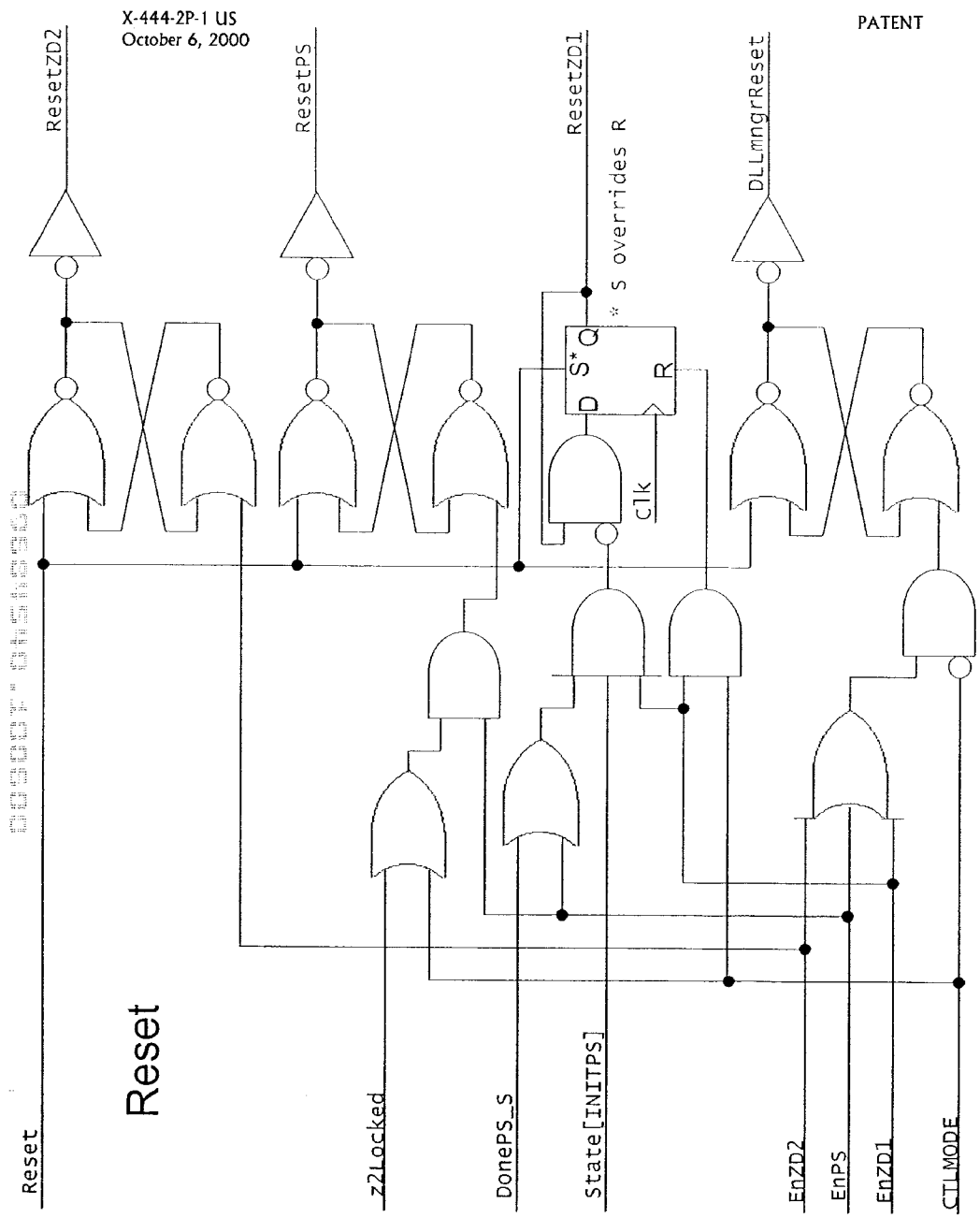

X-444-2P-1 US
October 6, 2000

PATENT

Reset Notes

This section generates reset signals for ZD2, PS, ZD1, and the DLLmngr itself. All resets go active while Reset is true. The various resets then go inactive (or not) as follows:

ResetZD2 - goes inactive immediately if EnZD2 is true; otherwise, it never goes inactive.

ResetPS - goes inactive immediately if EnPS & CTLMODE are both true, else goes inactive when ZD2 locks, if EnPS is true; otherwise, it never goes inactive.

ResetZD1 - goes inactive immediately if EnZD1 & CTLMODE are both true; otherwise, it goes inactive synchronous to the rising edge of Clk when signal RelResetZD1 is true.

DLLmngrReset - goes inactive immediately if any of ZD2, PS, or ZD1 are enabled AND Test Mode is not selected. Otherwise, it never goes inactive.

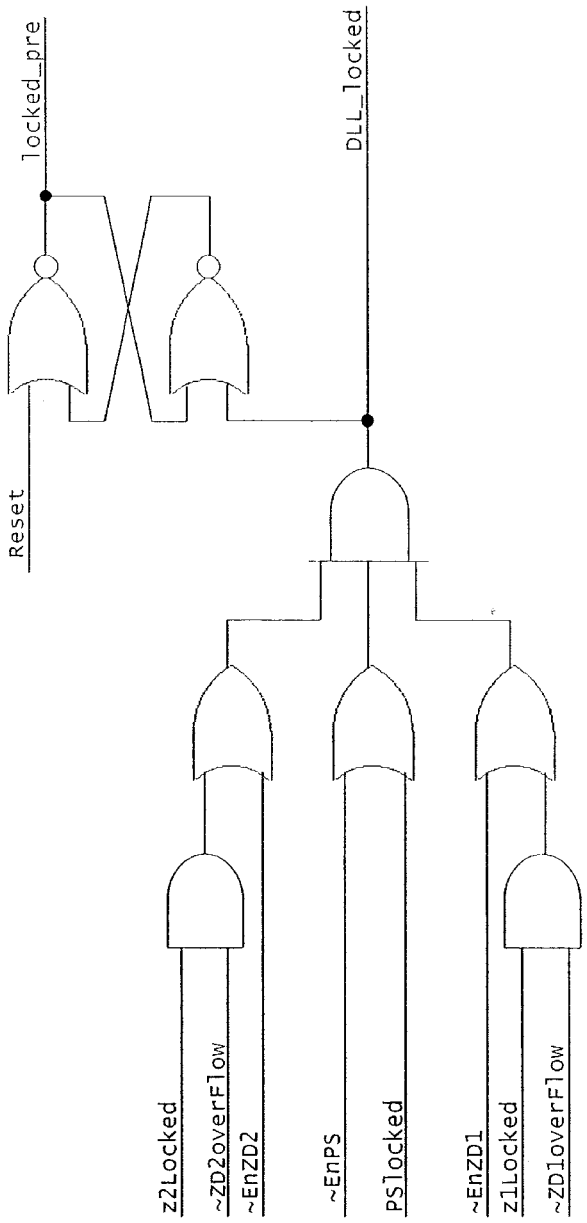

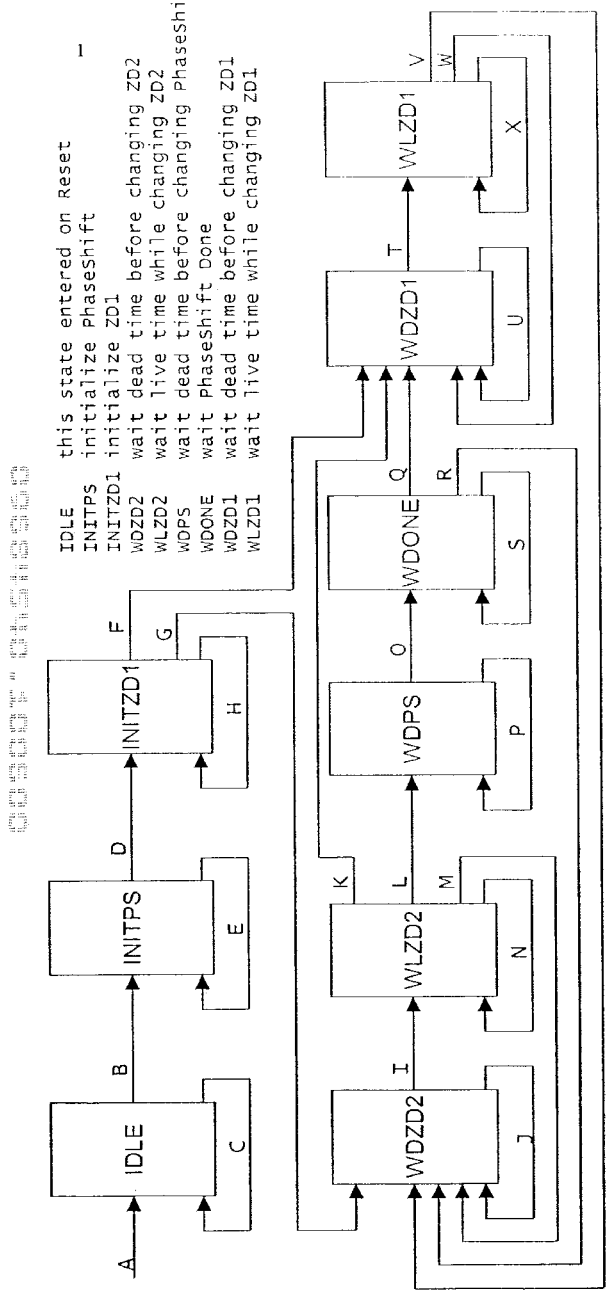

We claim:

1. A method of controlling phase shift between a reference clock signal and a generated clock signal, the method comprising the steps of:

using a first delay line to derive a first control signal that corresponds with one period of the reference clock signal;

selecting a second control signal that corresponds with a desired amount of phase shift between the reference clock signal and the generated clock signal, the second control signal defining a fraction of the period of the reference clock signal; and determining a setting of a second delay line in response to the first and second control signals, wherein the second delay line is coupled in the path of either the reference clock signal or the generated clock signal.

2. The method of claim 1, further comprising the steps of:

determining a first delay constant representative of a first overhead delay associated with the first delay line;

combining the first control signal and the first delay constant to create a third control signal that corresponds with one period of the reference clock signal; and determining the setting of the second delay line in response to the second and third control signals.

3. The method of claim 2, wherein the first overhead delay is associated with a first range of frequencies of the reference clock signal.

4. The method of claim 1, further comprising the steps of:

determining a first delay constant corresponding with a first overhead delay of the first delay line, the first overhead delay being associated with a first range of frequencies of the reference clock signal;

determining a second delay constant corresponding with a second overhead delay of the first delay line, the second overhead delay being associated with a second range of frequencies of the reference clock signal;

selecting the first delay constant or the second delay constant in view of the frequency of the reference clock signal;

combining the selected one of the first and second delay constants and the first control signal to create a third control signal that corresponds with one period of the reference clock signal;

determining the setting of the second delay line in response to the second and third control signals.

5. The method of claim 1, wherein the setting of the second delay line is determined by multiplying the first and second control signals, and dividing the result by a constant.

6. The method of claim 1, further comprising the step of modifying the setting of the second delay line through a user interface.

7. The method of claim 1, further comprising the step of asserting an overflow signal if the determined setting of the second delay line exceeds a range of the second delay line.

8. The method of claim 1, further comprising the steps of:

introducing a first delay, equal to about half of the total delay of the second delay line, to the generated clock signal using a fixed delay line; and then adjusting the delay of the second delay line to a delay corresponding to the desired amount of phase shift.

9. The method of claim 1, further comprising the step of coupling the second delay line into the path of the reference clock signal to cause the generated clock signal to lag the reference clock signal.

10. The method of claim 1, further comprising the step of coupling the second delay line into the path of the generated clock signal to cause the reference clock signal to lag the generated clock signal.

11. The method of claim 1, further comprising the step of coupling the second delay line in the path of the generated clock signal to cause the reference clock signal to either lead or lag the generated clock signal.

12. The method of claim 1, further comprising the step of coupling the second delay line in the path of the reference clock signal to cause the generated clock signal to either lead or lag the reference clock signal.

13. The method of claim 1, wherein the first control signal is derived by the steps of:

applying the reference clock signal or a clock signal derived from the reference clock signal to the first delay line;

adjusting tap/trim settings of the first delay line such that the clock signal entering the first delay line is synchronized with a clock signal exiting the first delay line; and then deriving the first control signal from the tap/trim settings of the first delay line.

14. The method of claim 1, further comprising the steps of:

adding delay to the reference clock signal with a third delay line; and controlling the first delay line, the second delay line and the third delay line, such that only one of these delay lines is adjusted at a time.

15. A system for providing a generated clock signal which is phase shifted with respect to a reference clock signal, the system comprising:

a first control circuit configured to generate a first control signal that is representative of the period of the reference clock signal; and a digital phase shifter configured to receive the reference clock signal, the generated clock signal and the first control signal, the digital phase shifter introducing a delay difference between the reference clock signal and the generated clock signal, thereby creating a phase shifted reference clock signal and a phase shifted generated clock signal, respectively, the duration of the delay difference being derived from the first control signal.

16. The system of claim 15, wherein the first control circuit comprises:

one or more delay lines, each having a plurality of delay units, the one or more delay lines connected in series; and a delay adjustment circuit configured to control the delay units of the one or more delay lines, wherein the delay adjustment circuit enables a number of delay units required to introduce a delay equal to one period of the reference clock signal.

17. The system of claim 16, wherein the first control signal is selected to correspond with the number of delay units required to introduce a delay equal to a predetermined fraction of one period of the reference clock signal.

18. The system of claim 17, wherein the digital phase shifter comprises circuitry for multiplying the first control signal by a reciprocal of the predetermined fraction, thereby creating a second control signal representative of one period of the reference clock signal.

19. The system of claim 18, wherein the digital phase shifter further comprises an adder configured to add a frequency dependent delay constant to the second control signal, thereby creating a third control signal representative of one period of the reference clock signal.

20. The system of claim 19, wherein the digital phase shifter further comprises circuitry for multiplying the third control signal by a user-selected fraction, thereby creating a fourth control signal representative of a delay associated with a desired phase shift.

21. The system of claim 20, further comprising means for setting the delay difference in response to the fourth control signal.

22. The system of claim 21, wherein the means for setting the delay difference comprise:
- a counter configured to store the fourth control signal;
- a phase shifting delay line that is configured in response to contents of the counter;
- a switching circuit configured to enable either the reference clock signal or the generated clock signal to be coupled to the delay line.

23. The system of claim 22, wherein the digital phase shifter further comprises a user interface enabling the counter to be adjusted in response to user-provided signals.

24. The system of claim 22, further comprising an overflow detection circuit which indicates when the phase shifting delay line is adjusted to an end of its range.

25. The system of claim 16, further comprising:
- a phase detector coupled to receive the phase shifted reference clock signal and the phase shifted generated clock signal, the phase detector providing a second control signal representative of a delay difference between the phase shifted reference clock signal and the phase shifted generated clock signal; and
- a system delay line coupled to receive the phase shifted reference clock signal and the second control signal, the system delay line being configured to adjust a delay introduced by the system delay line such that the phase shifted reference clock signal is synchronized with the phase shifted generated clock signal.

26. The system of claim 25, further comprising a state machine that only allows one of the system delay line, the one or more delay lines in the first control circuit and the delay difference introduced by the digital phase shifter to be adjusted at any given time.

27. The system of claim 15, wherein the digital phase shifter comprises:
- a fixed delay line;
- an adjustable delay line; and
- a switching circuit for selectively routing the reference clock signal through the fixed delay line and the generated clock signal through the adjustable delay line, or routing the reference clock signal through the adjustable delay line and the generated clock signal through the fixed delay line.

28. A method of operating a delay lock loop comprising the steps of:
- applying a reference clock signal or a clock signal derived from the reference clock signal to a clock phase shifter of the delay lock loop;
- allowing the clock phase shifter to lock on the reference clock signal or the clock signal derived from the reference clock signal, whereby the clock phase shifter provides a control signal representative of the period of the reference clock signal when locked;
- disabling a digital phase shifter and a delay line of the delay lock loop while the clock phase shifter is locking;
- allowing the digital phase shifter to lock in response to the control signal provided by the clock phase shifter, the digital phase shifter introducing a delay between the reference clock signal and a skew clock signal, thereby creating a phase shifted reference clock signal and a phase shifted skew clock signal;
- disabling the clock phase shifter and the delay line when the digital phase shifter is locking;
- allowing the delay line to lock, such that the phase shifted reference clock signal is synchronized with the phase shifted skew clock signal; and
- disabling the clock phase shifter and the digital phase shifter when the delay line is locking.

29. The method of claim 28, wherein the steps recited in claim 28 are repeated during normal operation of the delay lock loop.

30. The method of claim 28, further comprising the step of generating overflow signals if the digital phase shifter attempts to wrap a delay line while attempting to lock.

31. The method of claim 28, further comprising the step of generating an overflow signal if the delay line attempts to wrap while attempting to lock.

* * * * *